United States Patent
Lee

(10) Patent No.: US 9,437,306 B2
(45) Date of Patent: Sep. 6, 2016

(54) NAND ARRAY ARCHITECTURE FOR MULTIPLE SIMUTANEOUS PROGRAM AND READ

(71) Applicant: Peter Wung Lee, Saratoga, CA (US)

(72) Inventor: Peter Wung Lee, Saratoga, CA (US)

(73) Assignee: APLUS FLASH TECHNOLOGY, INC, Fremont, CA (US)

(*) Notice: Subject to any disclaimer, the term of this patent is extended or adjusted under 35 U.S.C. 154(b) by 0 days.

(21) Appl. No.: 14/979,459

(22) Filed: Dec. 27, 2015

(65) Prior Publication Data

US 2016/0111162 A1 Apr. 21, 2016

Related U.S. Application Data

(62) Division of application No. 14/316,936, filed on Jun. 27, 2014, now Pat. No. 9,263,137.

(51) Int. Cl.

| | |
|---|---|
| *G11C 16/04* | (2006.01) |
| *G11C 16/10* | (2006.01) |
| *G11C 16/26* | (2006.01) |
| *G11C 8/12* | (2006.01) |
| *G11C 11/56* | (2006.01) |
| *G11C 16/34* | (2006.01) |
| *G11C 16/24* | (2006.01) |

(52) U.S. Cl.
CPC ............... *G11C 16/10* (2013.01); *G11C 8/12* (2013.01); *G11C 11/5628* (2013.01); *G11C 16/0483* (2013.01); *G11C 16/24* (2013.01); *G11C 16/26* (2013.01); *G11C 16/3445* (2013.01); *G11C 16/3459* (2013.01)

(58) Field of Classification Search
CPC ............ G11C 16/0483; G11C 17/123; G11C 2213/75; H01L 27/11524; H01L 27/11529; H01L 27/1157
USPC ........................................ 365/185.17, 185.22
See application file for complete search history.

(56) References Cited

U.S. PATENT DOCUMENTS

| | | | | |
|---|---|---|---|---|
| 9,171,627 B2* | 10/2015 | Lee | ......................... | G11C 16/10 |
| 2013/0128667 A1* | 5/2013 | Lee | ......................... | G11C 16/10 365/185.11 |

* cited by examiner

*Primary Examiner* — Huan Hoang
(74) *Attorney, Agent, or Firm* — Raywell Group LLC

(57) ABSTRACT

This invention discloses a HiNAND array scheme with multiple-level of bit lines (BLs) including metal3 global bit lines (GBLs), divided metal2 Segment bit lines (SBLs), and divided metal1 block bit lines (BBLs) laid out in parallel to each other respectively for a plurality of NAND Strings. All other source lines or power lines connected to bottoms of corresponding String capacitances of GBLs, SBLs, and BBLs are associated with metal0 line laid out perpendicular to those BLs. Under the HiNAND array scheme, conventional one-WL Read and Program-Verify operations are replaced by multiple-WL and All-BL Read and Program-Verify operations executed with charge capacitance of SBLs being reduced to $\frac{1}{10}$-$\frac{1}{20}$ of capacitance of GBLs to achieve DRAM-like faster operation, less operation stress, and lower power consumption. A preferred set of program biased voltages on the selected WL and remaining non-selected WLs associated with a Multiplier and a DRAM-like charge-sharing Latch Sensing Amplifier is proposed.

21 Claims, 9 Drawing Sheets

| Multiple WL Read Operation | | Pre-discharge GBL/SBL/BBL | Pre-charge SBL/BBL | Discharge SBL/BBL of On-cell | Charge Sharing | Multiplying | Sensing |
|---|---|---|---|---|---|---|---|
| | G_PRE | Vdd | 0V | 0V | 0V | 0V | Vdd |
| | GBLps | 0V | 0V | 0V | 0V | 0V | 0V |
| DST | Current Sel Group | 0V | 0V | 0V | 0V | Vdd | 0V |
| DST | Next Sel Group | 0V | 0V | 0V | 0V | 0V | 0V |
| | B_PRE | Vdd | 0V | 0V | 0V | 0V | 0V |
| | BBLps | 0V | 0V | 0V | 0V | 0V | 0V |
| | CSL | 0V | 0V | 0V | 0V | 0V | 0V |
| | SEC | Vpass2 | Vpass2 | Vpass2 | Vpass2 | Vpass2 | Vpass2 |
| SSL | Sel Block | 0V | ≤Vdd | ≤Vdd | ≤Vdd | ≤Vdd | ≤Vdd |
| SSL | Unsel Block | 0V | 0V | 0V | 0V | 0V | 0V |
| | S_PRE | Vdd | Vpass2 | 0V | 0V | 0V | 0V |
| | SBLps | 0V | Vpch | Vpch | Vpch | Vpch | Vpch |
| GSL | Sel Block | 0V | 0V | Vpass2 | Vpass2 | Vpass2 | 0V |
| GSL | Unsel Block | 0V | 0V | 0V | 0V | 0V | 0V |
| WL — Sel Block | Sel WL | 0V | Vrm | Vrm | Vrm | Vrm | 0V |
| WL — Sel Block | Unsel WL | 0V | Vread | Vread | Vread | Vread | 0V |
| WL | Unsel Block | 0V | 0V | 0V | 0V | 0V | 0V |
| Sel Block | BBL | 0V | Vpch | Vpch or 0V | Vpch/M or 0V | Vpch/M or 0V | Vpch/M or 0V |
| Sel Block | SBL | 0V | Vpch | Vpch or 0V | Vpch/M or 0V | Vpch/M or 0V | Vpch/M or 0V |
| | Unsel Block | 0V | 0V | 0V | 0V | 0V | 0V |
| GBL | On-Cell | 0V | 0V | 0V | Vpch/M | Vpch/M | 0V |
| GBL | Off-Cell | 0V | 0V | 0V | 0V | 0V | 0V |

Vrm is Read operation voltage at WL, m=1 for SLC or m=1,2,3 for MLC; Vread~6V is a pass WL voltage; Vpass2 is a pass gate voltage ranging from Vdd to 7V, Vpch is a precharge voltage, Vpch/M is a reduced GBL voltage due to charge-sharing

Fig. 5

| Multiple WL Program Operation | | | Pre-discharge GBL/SBL/BBL | Pre-charge BBL | Latch MV In BBL | Turn off Pre-charge of BBL | Sample Current Data | Hold Current Data | Program |
|---|---|---|---|---|---|---|---|---|---|
| G_PRE | | | Vdd | 0V | 0V | 0V | 0V | 0V | 0V |
| GBLps | | | 0V | 0V | 0V | 0V | 0V | Vpass2 | 0V |
| DST | Current Sel Group | | 0V | Vpass2 | 0V | 0V | Vpass2 | Vpass2 | 0V |
| | Next Sel Group | | 0V | 0V | 0V | 0V | 0V | 0V | 0V |
| B_PRE | Current Sel Group | Sel Segment | Vdd | Vpass2 | Vdd | 0V | 0V | 0V | 0V |
| | | Unsel Segment | 0V | 0V | 0V | 0V | 0V | 0V | 0V |
| | Next Sel Group | Sel Segment | 0V | 0V | 0V | 0V | 0V | 0V | 0V |
| | | Unsel Segment | 0V | 0V | 0V | 0V | 0V | 0V | 0V |
| BBLps | Current Sel Group | Sel Segment | 0V | MV | MV | 0V | 0V | 0V | 0V |
| | | Unsel Segment | 0V | 0V | 0V | 0V | 0V | 0V | 0V |
| | Next Sel Group | Sel Segment | 0V | 0V | 0V | 0V | 0V | 0V | 0V |
| | | Unsel Segment | 0V | 0V | 0V | 0V | 0V | 0V | 0V |
| CSL | | | 0V | Vdd | Vdd | Vdd | Vdd | Vdd | Vdd |
| SEC | Current Sel Group | Sel Segment | 0V | 0V | 0V | 0V | Vdd | 0V | 0V |
| | | Unsel Segment | 0V | 0V | 0V | 0V | 0V | 0V | 0V |
| | Next Sel Group | Sel Segment | 0V | 0V | 0V | 0V | 0V | 0V | 0V |
| | | Unsel Segment | 0V | 0V | 0V | 0V | 0V | 0V | 0V |

Fig. 6

--- Continue to Next Page

| Multiple WL Program Operation | | | Pre-discharge GBL/SBL/BBL | Pre-charge BBL | Latch MV In BBL | Turn off Pre-charge of BBL | Sample Current Data | Hold Current Data | Program |
|---|---|---|---|---|---|---|---|---|---|
| SSL | Sel Block | | 0V | Vpass2 | Vdd | Vdd | Vdd | Vdd | Vdd |
| | Unsel Block | | 0V | 0V | 0V | 0V | 0V | 0V | 0V |
| | S_PRE | | Vdd | 0V | 0V | 0V | 0V | 0V | 0V |
| | SBLps | | 0V | 0V | 0V | 0V | 0V | 0V | 0V |
| | GSL | | 0V | 0V | 0V | 0V | 0V | 0V | 0V |
| WL | Sel Block | Unsel WL(erased) | 0V | Vpass1 | Vpass1 | Vpass1 | Vpass1 | Vpass1 | Vpass1 |
| | | Sel WL | 0V | Vpass1 | Vpass1 | Vpass1 | Vpass1 | Vpass1 | Vpgm |
| | | Unsel Adj WL(pgmed) | 0V | Vpass2 | Vpass2 | Vpass2 | Vpass2 | Vpass2 | Vpass2 |
| | | Unsel WL(pgmed) | 0V | Vdd | Vdd | Vdd | Vdd | Vdd | Vdd |
| | Unsel Block | | 0V | 0V | 0V | 0V | 0V | 0V | 0V |
| BBL | Current Sel Group | Sel Segment | 0V | MV | MV | MV | MV or 0V | MV or 0V | MV or 0V |
| | | Unsel Segment | 0V | 0V | 0V | 0V | 0V | 0V | 0V |
| | Next Sel Group | Sel Segment | 0V | 0V | 0V | 0V | 0V | 0V | 0V |
| | | Unsel Segment | 0V | 0V | 0V | 0V | 0V | 0V | 0V |
| SBL | Current Sel Group | | 0V | 0V | 0V | 0V | Vdd or 0V | Vdd or 0V | Vdd or 0V |
| | Next Sel Group | | 0V | 0V | 0V | 0V | 0V | 0V | 0V |
| GBL | On-Cell | | 0V | Vdd | Vdd | Vdd | Vdd | Vdd | Vdd |
| | Off-Cell | | 0V | 0V | 0V | 0V | 0V | 0V | 0V |

Vpgm > Vpass2 > Vpass1 ≥ MV > Vdd

Fig. 6
(continued)

| | MC(WL[1]) | MC(WL[2]) | MC(WL[3]) | MC(WL[4]) | ... | MC(WL[61]) | MC(WL[62]) | MC(WL[63]) | MC(WL[64]) |
|---|---|---|---|---|---|---|---|---|---|
| SSL | Vdd | Vdd | Vdd | Vdd | ... | Vdd | Vdd | Vdd | Vdd |
| WL[1] | Vpgm | Vpass1 | Vpass1 | Vpass1 | ... | Vpass1 | Vpass1 | Vpass1 | Vpass1 |
| WL[2] | Vpass2 | Vpgm | Vpass1 | Vpass1 | ... | Vpass1 | Vpass1 | Vpass1 | Vpass1 |
| WL[3] | Vdd | Vpass2 | Vpgm | Vpass1 | ... | Vpass1 | Vpass1 | Vpass1 | Vpass1 |
| WL[4] | Vdd | Vdd | Vpass2 | Vpgm | ... | Vpass1 | Vpass1 | Vpass1 | Vpass1 |
| ... | ... | ... | ... | ... | ... | ... | ... | ... | ... |
| WL[61] | Vdd | Vdd | Vdd | Vdd | ... | Vpgm | Vpass1 | Vpass1 | Vpass1 |
| WL[62] | Vdd | Vdd | Vdd | Vdd | ... | Vpass2 | Vpgm | Vpass1 | Vpass1 |
| WL[63] | Vdd | Vdd | Vdd | Vdd | ... | Vdd | Vpass2 | Vpgm | Vpass1 |
| WL[64] | Vdd | Vdd | Vdd | Vdd | ... | Vdd | Vdd | Vpass2 | Vpgm |
| GSL | 0V | 0V | 0V | 0V | ... | 0V | 0V | 0V | 0V |
| CSL | Vdd | Vdd | Vdd | Vdd | ... | Vdd | Vdd | Vdd | Vdd |
| BBL on-cell | MV | MV | MV | MV | ... | MV | MV | MV | MV |
| BBL off-cell | 0V | 0V | 0V | 0V | ... | 0V | 0V | 0V | 0V |

Vpgm > Vpass2 > Vpass1 ≥ MV > Vdd

Fig. 7

NAND ARRAY ARCHITECTURE FOR MULTIPLE SIMUTANEOUS PROGRAM AND READ

1. CROSS-REFERENCES TO RELATED APPLICATIONS

This application is a divisional application of and claims priority to U.S. patent application Ser. No. 14/316,936 filed on Jun. 27, 2014 which claims priority to U.S. Provisional Application No. 61/840,020, filed Jun. 27, 2013, commonly assigned and incorporated by reference herein for all purposes.

Additionally, this application is related to U.S. Pat. Nos. 7,440,318, 7,570,517, RE43,665 E, and 7,262,994, which are incorporated by reference herein for all purposes.

This application is further related to an article titled "A 3.3V 128 Mb Multi-Level NAND Flash Memory for Mass Storage Applications" by Tae-Sung Jung, etc., Samsung Electronics, Solid-State Circuits Conference, Feb. 10, 1996. Digest of Technical Papers. 42nd ISSCC. 1996 IEEE International, page 32-33; and an article titled "A 1.8V 2 Gb NAND Flash Memory for Mass Storage Applications" by June Lee et al., IEEE J Solid-State Circuits, vol. 38, No. 11, November 2003, pp. 1934-1942.

2. BACKGROUND OF THE INVENTION

This invention relates generally to all 2D and 3D NAND array architecture circuits. In particular, the present invention provides HiNAND array architecture circuits that include several preferred new circuits such as Segments and Groups into the NAND array along with a feature of circuit migration from conventional one-Block-one-row selection of Page Buffer, Sense Amplifiers, and Block-decoders in State-machine design to multiple Programs and Reads in Multiple-Block-Multiple-Rows in different Planes.

Nonvolatile memory (NVM) is well known in the art which provides the in-system or in-circuit repeatedly electrically programmable and erasable functions. So far, NVMs include three major standalone types such as EEPROM, NOR, and NAND Flash memory and one embedded type Flash (eFlash) memory. All above four NVMs are based on varied technologies.

The EEPROM is suitable for the Byte-alterable Data storage with the highest density below 4 Mb at 0.13 um node. The NOR flash is suitable for the block-alterable Code storage with the highest density below 8 Gb at 45 nm node. The eFlash is suitable for the page-alterable Code storages with the highest density below 64 Mb at 65 nm node. Lastly, NAND flash is suitable for the Segment-alterable Data storage with the highest density below 256 Gb at 19 nm node in MLC storage.

Currently, NAND flash memory has achieved the highest scalability, density and smallest feature of 1xnm node since 2012. The mainstream standalone NAND in mass production is mainly based on 2-poly floating-gate NMOS device, which employs 20V but the extremely low current FN channel-erase and FN channel-program schemes.

The NAND flash cell array comprises a plurality of NAND Strings that are organized in a matrix as a Plane with a plurality of rows and columns. Each NAND String is further comprised of a plurality of NMOS NAND cells connected in series sandwiched by two NMOS 1-poly String-select transistors, for example, MS located on top of the String and MG on bottom of the String. The number of NAND flash cells in one String can be made of 8, 16, 32, 64, 128 or arbitrary integer number, depending on NAND density requirement and applications. Each NAND cell has several different types of storages that include SLC (1 bit per cell), MLC (2 bits per cell), TLC (3 bits per cell), XLC (4 bits per cell) and even analog storage that stores more than 4 bits per NAND cell.

Today, a typical extremely high-density, nGb, NAND flash array architecture is comprised of a plurality of NAND Planes cascaded in rows in X-direction and columns in Y-direction. The number of rows and columns of each NAND Plane can be 2, 4 or 8 or more and is optimally determined by the trade-off of the chip layout and performance.

Each NAND Plane is further comprised of a plurality of NAND Blocks that are then physically cascaded one-by-one in the Y-direction and each NAND Block is further comprised of a plurality of NAND Strings cascaded in a row in the X-direction. Each NAND String includes a plurality of NAND cells, for example, M cells connected in series and sandwiched by one top String-select transistor and one bottom String-selected transistor. The value of M can be 8, 6, 32, 64, 128 or any arbitrary integer number, depending on the NAND specs and applications. The numbers of optimal Planes, Rows, Blocks and Strings are fully determined by the trade-off of the design factors such as the optimal chip size, chip performance, design features and reliability concerns of the NAND flash memory.

In the exemplary case of 1-row and 2-plane NAND flash memory, the main NAND Plane-decoder is preferably placed in the middle of the NAND array between left and right NAND Planes. The Block-decoder can be flexibly placed in the middle of the NAND array between two horizontal NAND Planes in one row so that each Block-decoder's multiple outputs can be used to drive the multiple selected word lines (WLs) of one selected corresponding NAND Strings placed either in left or right Plane.

In optimal layout, two big independent PBs (Page-Buffers) and SA (Sense Amplifier) circuit blocks are physically placed right on top of left and right NAND Planes across whole NAND array in the X-direction. The PB may include multiple latches with inputs and outputs to store the data read from the corresponding bit lines (BLs) of NAND flash cells or from the external data lines.

For the array organization of a 2-plane, 1-row NAND flash memory with a condition that only one Plane can be selected at a time for Read, Program, Program-Verify and Erase-Verification, then only group of Blocks are selected either from the left or right NAND Plane. If the array design allows two NAND planes to be selected simultaneously, then two groups of Blocks of both left and right Planes can be selected with 2-fold faster speed of Read and Program operations.

For the array organization of a 1-plane, 1-row NAND flash memory, then the Block-decoder is preferably placed in one end of the NAND array. In such a layout arrangement, the Block-decoder's multiple outputs can be used to drive the multiple selected WLs in the selected corresponding Strings of the select Block of NAND memory.

There exist other NAND array organizations such as NxM matrix of N rows and M Planes. Nevertheless, unless each Plane has its own PB circuit, multiple Blocks in different NAND Planes in different rows cannot be selected because PB and BLs are shared by all NAND Blocks cascaded vertically in the Y-direction. The operation of the selected Blocks in the same row of the selected NAND Plane has to be done sequentially one by one to avoid the data contention in BLs and PB.

Now, key Program operation of a conventional NAND is explained below via FIG. 1 and FIG. 2. FIG. 1 shows a typical NAND array with one portion of Block and one Sense Amplifier (SA) shared by one paired NAND Strings such as one Odd String with its drain node coupled to BLo metal bit line and one Even String with its drain node coupled to another BLe metal line. The whole NAND Block memory comprises a plurality of pairs of BLe and BLo (although only one pair of BLe and BLo is shown). In this example, the SA contains one Sensing and Precharging circuit and one Latch circuit for SLC Program and Read operation.

This NAND array has one metal line (metal0) for common source line (CSL) and another metal line (metal1) with an x-pitch size of 2λ for both BLe and BLo. The BLe and BLo are like GBL (global bit line) running from NAND array top and are connected the outputs of PB to the array bottom without being divided into a plurality of divided-BLs such as local bit lines (LBLs). In other words, along BL or a column in Y-direction in the array layout, the NAND array is made of a single metal1 NAND array.

In each BLo or BLe, it directly connects to a plurality of NAND Strings. Each NAND String, in this example, comprises 32 2-poly NMOS NAND cells connected in series sandwiched by one top 1-poly NMOS String-BL-select transistor MSe in BLe or MSo in BLo, gated by a common signal of SLL, and one bottom 1-poly NMOS String-SL-select transistor, MG1 in BLe or MG2 in BLo, gated by another common signal of GSL. The 32 NAND gates of each String are connected to 32 WLs such as WL[1] to WL[32].

Besides the NAND array, one sensing Latch circuit per each pair of BLe and BLo with PRESET, PLOAD, and PBLCH control signals for Program-Verify function are also shown in FIG. 1. Since one pair of BLo and BLe shares one sensing Latch circuit comprising two inverters INV1 and INV2, thus only one NAND String in either BLo or BLe is selected for Read operation in this NAND array. Therefore this conventional NAND array and sensing Latch circuit do not offer ALL-BL Read. In other words, to read a whole physical page requires two sub-steps to read either BLe group first and then BLo group later or vise versa.

Furthermore, in this conventional NAND array, only two Strings are shown with one pair of BLo and BLe. In fact, a full NAND array includes up to 4 KB pairs of BLo and BLe lines per WL or per physical page with a 8 KB size. Similarly, there are pluralities of NAND Strings in each BLo and BLe. The number of NAND Strings is subject to the required NAND density.

The so-called All-BL Program operation means that the Program size is one physical page and is performed in 1-cycle. But an Odd/Even page Program operation means that the Program operation is performed in unit of a logic page which is half of whole physical page. The whole physical Program operation needs a 2-cycle Read operation of two half-page Program operations. Programming bias conditions are summarized below:

a) Selected Flash cells' gate voltage WL in selected page to Vpgm ranging from 15V to 25V with Incremental Step Pulse Programming (ISPP) scheme and ΔVpgm ranging from 0.15V to 0.2V for MLC-type and TLC-type storage.

b) Selected Flash cell's channel voltage to 0V. This 0V is coupled from the corresponding bit data=0 in Page Buffer. The 0V is coupled to the NAND cells of the selected WL through a NMOS BL-Select transistor that is turned on in a conduction state. The advantage of Program BL=0V lies in that no BL precharge current is required.

c) Unselected Flash cells' channel voltage $V_{Inhibit} \geq 7V$ for Program-Inhibit operation. This $V_{Inhibit}$ voltage is generated by WL-gate coupling effect to boost the initial floating channel voltage of Vdd-Vt of bit data=1 in Page Buffer to 7V of unselected NAND cells in the same selected page or WL. This is referred as a Self-Boosting (SB) effect. The disadvantage Program-Inhibit BL=Vdd lies in that multiple high BL precharged currents are required because it needs to change the selected BL to Vdd.

d) NAND Program scheme: A low current FN channel tunneling effect to increase NAND cell's Vt from E state (erased state) to three program states such as A, B, or C state for a MLC storage.

e) Program-Inhibit voltage generation methods include SB, LSB and EASB.

In a typical NAND Program operation, a high step-rising program voltage, Vpgm, ranging from 15V to 25V, is applied to one selected WL[m], but a Vpass(program) voltage of around 10V is applied to the rest of 31 (assuming total 32 WLs in each Block) non-selected WLs in the selected Strings along with the gate of bottom String-select transistor connected to Vss and the gate of top String-select transistor connected to Vdd.

As a result, 31 NAND cells in same String are in conduction-state while the String's bit line is grounded. The plurality of electrons from the selected NAND cells' channels are injected into the floating gate layer, Poly1, and NAND cells' threshold voltage, Vt, are raised from an erased Vt0 at E-state with a negative value to a desired positive value of Vt1 referred to a first programmed state, A-state.

More information about the programming methods can be found in U.S. Pat. No. 6,859,397, titled "Source Side Boosting Technique for Non-volatile Memory;" and U.S. Pat. No. 6,917,542, titled "Detecting Over Programmed Memory;" and U.S. Pat. No. 6,888,758, titled "Programming Non-Volatile Memory."

In many cases, Vpgm pulse is applied to the selected WL[m] of NAND associated with several MHV pass-WL voltages such as Vpass(program) voltages, Vpass1, Vpass2, and others, applied to the non-selected WL[m−1] and WL[m+1] and the rest of WL[m] in the selected NAND Strings of the selected Blocks.

A series of Vpgm pulses (referred to as the programming gate pulses), with the magnitude of the pulses increasing are applied to WL[m]. Between each rising-step Vpgm pulse, a set of single or multiple Program Verify pulses like Read operation are performed to determine whether the selected NAND cells(s) in the selected page or WL are being programmed into the desired programmed Vtn values. The programmed Vtn values are determined by the type of storages such as SLC (1-bit per cell), MLC (2-bit per cell), TLC (3-bit per cell), XLC (4-bit per cell) or analog storage (more than 4-bit per cell).

Since Program-Verify operation is like the regular Read operation, the previously mentioned BL-precharge cycle and discharge cycle would be the same. Therefore, during each Program-Verify cycle, a NAND flash memory has to precharge all long BLs' large capacitance from Vss to VBL as described before. As a result, a large BL precharge current occurs and the large Vpass(read) 6V WL disturbance will be induced on NAND cell. In addition, Program-Verify cycle also has a long latency as Read due to the discharge process starts from a high value of $V_{BL}$, which ranges from 0.8V to Vdd in today's NAND design.

If any of the selected NAND cells have reached their targeted programmed Vts as determined in Program-Verify step, then the further programs have to be stopped on those NAND cells to avoid over-programming into a next higher wrong Vt state. For those NAND cells' Vts that do not reach the desired value after Program-Verify operation, then the Vpgm pulses continue applying to those NAND cells in the selected page or WL associated with Vpass voltage of 10V or other HV to the non-selected WLs. If the desired Vts are not reached, then the programming and verify pulses would be repeatedly applied to those cells. Until all NAND cells in the selected page have been programmed successfully into the desired Vt states, then the Program and Program-Verify operations of the selected page would be stopped. The Program and Program-Verify operations would be continued on those remaining pages in the preferred sequence from String bottom to the String top in the selected Strings of the selected Blocks of the NAND memory. As the Program and Program-Verify operations repeat, the BL precharge current and Vpass WL-induced disturbance will be multiplied.

Typically, each NAND string physically comprises 16, 32, 64, or even 128 WLs. The MLC page number is doubled to SLC page number, TLC density is tripled, and XLC density is quadrupled.

A multi-state NAND memory device stores multiple bits of data per NAND cell by differentiating multiple distinct valid Vtn distributions separated by some preferred forbidden ranges such as ΔVtn. Each distinct Vtn has a distribution between $Vtn_{max}$ and $Vtn_{min}$. Each ΔVtn is defined to be a value of $Vtn_{min}$ of a higher-level state minus the $Vtn_{max}$ of a lower-level Vtn state. Each Vtn is defined corresponding to a predetermined value for the set of data bits encoded in NAND device. As the number of bits of data per NAND cell is increased from SLC to MLC, TLC, and XLC, the number of valid Vtn states increases from 2 to 4, 8 and 16. As a result, the NAND data capacity is drastically increased, thus the die cost is greatly reduced.

There is a tradeoff. When each NAND cell storage capacity is programmed to increase, however, the programming time also increases and NAND cell's data reliability greatly degrades accordingly. In some applications, the increased programming time and the lower data reliability cannot be accepted.

Below, the conventional NAND Read and Program-Verify operations will be examined in term of Read disturbance, Read cycle, Read current and Read latency. FIG. 2 shows some typical time lines of some key control signals for properly operating the conventional NAND array as seen in FIG. 1. These key control signals include BLSHF, PBRST, PLOAD, SO & BLe or SO & BLo, PBLCH, Node A, WL (Selected one) and WLs (unselected 31 ones), etc for operating BL precharge and discharge, charge up of one selected WL and 31 unselected WLs, and proper control sequences for NAND data sensing and latch function for SLC Read. For each Read operation, a predetermined $V_{RD}$ voltage is applied to the selected WL and the a WL-pass voltage Vpass ranging from 5 to 7V is applied to the unselected N−1 WLs to turn the N−1 NAND cells into the conduction state so that the On state or Off state of the selected NAND cells can be accurately distinguished. The single $V_{RD}$ value of 0V is used for a SLC Read. But three distinct $V_{RD}$ values of 0V, 1.5V, and 3V are for a MLC Read and 7 distinct $V_{RD}$ values are used for TLC Read and 15 distinct $V_{RD}$ values are used for XLC Read.

Since each SLC Read from NAND String, all the non-selected cells in the non-selected WLs or pages suffer Vpass WL disturbance. For MLC Read, it will suffer 3 times Vpass WL disturbance, for TLC Read it will suffer 7 times Vpass WL disturbance, and for XLC Read it will suffer 15 times Vpass WL disturbance. As a result, the Vpass WL disturbance becomes more severe issue in NAND memory with higher storage compression. In addition, each Read of NAND programmed states of A, B and C would consume one high BLn precharge current.

Today, the averaged Read latency is 20 μS per page but Program latency is 200 μS for SLC Program and 600 μS is for MLC Program. Both Read and Program operations can only be performed in unit of whole physical page in one cycle or two-cycle Read for Odd and Even logic pages. All this Read and Program specs have not changed for 25 years. But when NAND technology is scaled down below 2×nm and the density being increased above 256 Gb, the above slow Read and Program latency becomes unacceptable for fast memory system applications. In addition, the high-power consumption and low P/E and Read cycles are getting the concerns.

As a result, it is highly desired to reduce Read and Program latency and power consumption and to increase the NAND reliability, P/E and Read cycles so that the less-sophisticated Error Correction Coding (ECC), DSP and Flash management tolls of Flash controller can be used at a lower cost. As an attempt to improve in this aspect, the present invention provides a HiNAND array adopting multiple-level BL architecture and a Non-Self-Boosting-Program-Inhibit method (Non-SBPI) along with other circuits such as Multiplier and XOR-Comparator to achieve the faster multiple-WL and All-BL Program and Read operations.

3. BRIEF SUMMARY OF THE INVENTION

This invention relates generally to all 2D and 3D NAND array architecture circuits. In particular, the present invention provides HiNAND array architecture circuits that include several preferred new circuits such as Segments and Groups into the NAND array along with a feature of circuit migration from conventional one-Block-one-row selection of Page Buffer, Sense Amplifiers, and Block-decoders in State-machine design to multiple Programs and Reads in Multiple-Block-Multiple-Rows in different Planes.

In an embodiment, the present invention provides a HiNAND2 array that comprises a 2-level BL-hierarchical structure that uses a group of metal2 lines for a plurality of global bit lines (GBLs) and another group of metal1 lines for a plurality of sub-bit lines (SBLs) in parallel to the group of metal2 lines and one more group of metal0 lines laid perpendicular to both metal1 and metal2 lines for all power or Vss lines such as source lines of NAND Strings, or source lines of a plurality of bottom BL-select (MSBL) transistors. The HiNAND2 is not shown in a separate figure but is substantially the similar to a 3-level HiNAND3 only with metal3 lines for divided BLs being removed.

In another embodiment, the present invention provides a HiNAND3 array that comprises a 3-level BL-hierarchical structure that uses a plurality of metal3 lines respectively for a plurality of GBLs and another plurality of metal2 lines respectively for a plurality of sub-BL lines (SBLs) and yet another plurality of metal1 lines respectively for a plurality of sub-sub-BL lines (BBLs), all these metal3, metal2, and metal1 lines are parallel to each other. The HiNAND3 array also comprises a plurality of metal0 lines laid perpendicular to metal1 lines for all power or Vss lines such as the source lines of NAND String, or the source line of a plurality of bottom BL-select (MSBL) transistors and top BL-select (MBBL) transistors.

In yet another embodiment, the present invention provides a HiNAND array that comprises a plurality of NAND Groups, a plurality of Segments laid 1-level down, and a plurality of Blocks laid 2-level down. Each Block comprises a plurality of NAND Strings and each NAND String further comprises 16, 32, 64, 128 or any integer number of NAND cells connected in series with top and bottom String-select transistors. Besides to have a n-level BL-hierarchical structure, a SL-hierarchical structure is also preferably with one pair of NMOS devices MBBL and MSBL formed on each of the divided BLs such as a SBL and a BBL in addition to the conventional String SLs.

In still another embodiment, the present invention provides a HiNAND array that comprises a LV GBL-Page Buffer (GBL-PB) circuit along with n-level BL-hierarchical structure with a desired local lowest level BL-capacitance to allow the temporary storages of Vss program voltage and $V_{Inhibit}$ program-inhibit voltage for the desired multiple-WL Program and Read operations. The $V_{Inhibit}$ voltage is Vdd or 7V higher.

In yet still another embodiment, the present invention discloses a HiNAND3 array that comprises a plurality of BBL parasitic capacitors and each BBL has one NMOS BL-select transistor MBBL that is intended to couple a middle level voltage up to $V_{Inhibit}$ voltage ~7V from a selected corresponding horizontal line BBLps for saving the power consumption for precharging BBLs to 7V. This $V_{Inhibit}$ voltage of about 7V is not coupled from the array top LV GBL-PB that would consumes too much current due to long and heavy parasitic GBL capacitance.

In an alternative embodiment, the present invention discloses a HiNAND3 array with a preferred set of the program-bias voltage conditions for programming the NAND cells of the selected Block in series with one single selected WL, Vpgm, and (M−1) non-selected WLs with Vpass1, Vpass2 and others. The value of M=32 for 32T-String HiNAND array or M=64 for a 64T-String HiNAND array, although other number is also theoretically possible. Assuming the programming start from the String bottom WL[M] serially to the String top WL[1], the preferred set of WL bias conditions includes setting the selected WL[m] to Vpgm, and setting a last WL[m+1] to Vpass2=10V to reduce the WL-WL punch-through voltage, and setting other WL[m+2]= . . . =WL[M]=Vdd for those NAND cells being programmed already but setting WL[m−1]= . . . =WL[1] to Vpass1=7V for those NAND cells not yet being programmed with erased Vts of −0.7V, where M=32 for a 32T-String in the HiNAND3 array or M=64 for a 64T-String in the HiNAND3 array. All NAND cells connected from WL[m−1] above the selected word line to WL[1] on the top end of a NAND String are associated with threshold voltages Vts equal to an erased Vt which is smaller than −0.7V.

In another alternative embodiment, the present invention provides a HiNAND array with each optimized Sub-BL capacitance being about 1/10 or 1/20 of each GBL-capacitance to allow fast All-BL one full physical-page Read operation. The traditional Read operation of conventional NAND precharges and discharges all long and heavy GBL lines (with large GBL-capacitances) using a Vdd-Vt voltage that consumes too much Read power current and suffers slower Read latency and more BL-BL coupling noise. Instead of that, this HiNAND array is configured to only precharge and discharge lighter local SBL-capacitance, thus leading to less Read disturbance, lower power consumption form and Read latency with near-zero BL-BL coupling noise.

In yet another alternative embodiment, the present invention provides a preferred set of bias voltage conditions for the fast multiple-WL & All-BL Program, Program-Inhibit, Program-Verify, and Read operations for the HiNAND array. Note, each WL Program or Read voltage can be performed in unit of All-BL structures with less power and disturbance than that for the conventional NAND array which can be programmed and read in only one WL size.

In still another alternative embodiment, the present invention provides an improved technique to allow flexible setting or resetting of each latch of each Block-decoder. In the conventional NAND architecture only one latch of Block-decoder is set to select one WL in one selected Block for Program and Read operations. In this HiNAND array, a new Block-decoder is configured to allow flexibility to set and reset multiple latches for the desired multiple-WL & All-BL simultaneous Read, Program-Verify, and Program operations.

The Program operation is preferably to be a serial Program scheme and is performed on the same locations of selected WLs on multiple selected Blocks preferably located in different Segments. The program sequence of HiNAND is preferably identical to that of the conventional NAND array from the bottom cell to the top cell of NAND String of one Block. The multiple-WL Read is to allow the random Read on all selected multiple WLs on multiple Blocks preferably in different Groups. One method of reading the same location of the selected WL in different Blocks in the different Segments and Groups is proposed. But traditional page data in multiple WLs in the same Block is preferably disposed in the same page location or WL in the different Segments so that the goal of random Read in NAND memory can be better retained in this preferred Multiple-WL and All-BL Read operation.

In a specific embodiment, the present invention discloses a technique for single LV GBL-PB to store m-page temporary data for M multiple-WL & All-BL Program and Program-Verify operations. The m-page is preferably to have more than one page but the value of m<M for an optimal PB size. The page data is preferably serially or parallelly loaded into this PB from off-chip Flash controller in a pipeline method. The page data can be in any storage form such as SLC, MLC, TLC and XLC or even 256-level Analog format.

In another specific embodiment, the present invention provides a technique for single LV GBL-PB to store K-page temporary data for M-WL & All-BL Program and Program-Verify operations. The K-page is preferably to have more than one page but the value of K<M for an optimal PB size. Additional pages of PB are used to temporarily store the K pages of read or program-verified page data and then be serially or parallelly loaded into I/O bus and read in pipeline form by off-chip Flash controller. As a result, the on-chip PB size can be reduced for this preferred Multiple-WL & All-BL Program, Program-Verify, and Read operations.

In yet another specific embodiment, the present invention discloses a technique for increasing speed of precharge and discharge of GBL through added 7V NMOS devices of MBBLs for each Segment or MSBLs for each Group. In the conventional NAND, the precharge and discharge of GBL has to go through one HV(20V) NMOS device with a much thicker gate (>300 A) and longer channel length per GBL. Now, a 7V NMOS device with thinner gate-oxide and shorter channel length can reduce the precharge and discharge time of GBL and reduce SBL and BBL lines and associated capacitances.

In still another specific embodiment, the present invention discloses a preferred Non-SBPI method to achieve a least Vpass WL program stress for a longer P/E cycles.

In an embodiment, the present invention provides a high-density NAND (HiNAND) circuit with multi-level BL-hierarchical architecture for lowering disturbance, power-consumption, and latency in Program, Program-Verify, and Read operations. The HiNAND circuit includes a matrix of NAND memory cells divided to J Groups in column-direction having N global bit lines (GBLs). Each Group is divided to L Segments in the column-direction and each Segment is further divided to K Blocks in the column-direction. Each Block includes N Strings in the column-direction or M Pages in row-direction and each String includes M NAND memory cells connected in series sandwiched by a top String-select transistor and a bottom String-select transistor. Each NAND memory cell in a Page is associated with a word line (WL). Here J, L, K, M, and N are integer numbers and J is at least greater than 10. The HiNAND circuit includes a BL-hierarchical structure comprising N metal3 lines corresponding to N metal2 lines and further to N metal1 lines all being parallel to each other along the column-direction. Each metal3 line is used as one the N GBLs across all J Groups of NAND memory cells, each metal2 line is used as one of N sub-BL lines (SBLs) associated with each column of NAND memory cells across all Segments in each Group, and each metal1 line is used as one of N sub-sub-BL lines (BBLs) across all Blocks in each Segment. The HiNAND circuit also includes a plurality of metal0 lines laid out along the row-direction. The plurality of metal0 lines includes at least one common source line connected to the N Strings of NAND memory cells in one or more Blocks of one or more Segments of each Group, a first power/Vss line for all J Groups, a second power/Vss line for all L Segments in a Group, and a third power/Vss line for all K Blocks in a pair of Segments in one Group. Additionally, the HiNAND circuit includes N first GBL-select transistors commonly controlled by a first gate signal to respectively couple the N GBLs with the first power/Vss line, N second GBL-select transistors commonly controlled by a second gate signal to respectively couple the N GBLs with the corresponding N SBLs, N first SBL-select transistors commonly controlled by a third gate signal to respectively couple the N SBLs with the second power/Vss line, N second SBL-select transistors commonly controlled by a fourth gate signal to respectively couple the N SBLs with the corresponding N BBLs, and N BBL-select transistors commonly controlled by a fifth gate signal to respectively couple the N BBLs with the third power/Vss line. Moreover, the HiNAND circuit includes a Page Buffer circuit respectively coupled to the N GBLs and configured to store and supply multiple page data in the form of sequential pipe-line. The BL-hierarchical structure in accordance with a preferred set of bias voltage conditions associated with at least the first gate signal, the second gate signal, the third gate signal, the fourth gate signal, and the fifth gate signal is configured to allow temporary storages of program voltage and program-inhibit voltage in the multiple BBLs in one or more Segments of one or more Groups for performing multiple-WL and All-BL Program, Program-Verify, and Read operations simultaneously with less power and disturbance.

In another embodiment, the present invention provide a method of performing simultaneous multiple-WL and All-BL Program operation in a HiNAND memory array with BL-hierarchical structure. The method includes providing the HiNAND memory array with BL-hierarchical structure as described above. Additionally, the method includes pre-discharging all N GBLs, N SBLs, and N BBLs to Vss=0V. The method further includes pre-charging the N BBLs in multiple selected Blocks of multiple selected Segments of one or more selected Groups concurrently to a MV voltage from the corresponding third power/Vss line and latching the MV voltage into a parasitic capacitance associated with each of the N BBLs. The MV voltage being substantially same as a program-inhibit voltage of ~7V. Furthermore, the method includes converting a page data having Vdd or Vss levels on all the N GBLs from the Page Buffer circuit for one selected page in each selected Block to a local data pattern in MV or Vss levels respectively on parasitic capacitances associated with the N BBLs and holding the local data pattern in MV or Vss levels respectively on each parasitic capacitance associated with the N BBLs. The method further includes performing Program operation independently on one selected page in the selected Block in accordance with the local data pattern by ramping a program voltage applied to the corresponding WL to Vpgm of about 20V. Moreover, the method includes performing Program operation on multiple pages concurrently in accordance with respective multiple local data patterns preset sequentially for respect multiple pages, the multiple pages belonging to different selected Blocks of the one or more Segments of the one or more selected Groups.

In an alternative embodiment, the present invention provides a method of performing multiple-WL & All-BL Read and Program-Verify operations in a HiNAND memory array with BL-hierarchical structure. The method includes providing the HiNAND memory array with BL-hierarchical structure as described above. Additionally, the method includes first pre-discharging N GBLs, N SBLs and N BBLs to Vss=0V and precharging the N BBLs and the N SBLs in one or more selected Groups to a pre-charge voltage ranging from Vdd to 7V. The method further includes discharging part of the N BBLs and the N SBLs to 0V in accordance with a page data stored in a selected page of NAND memory cells. Furthermore, the method includes sharing the pre-charge voltage in the remaining part of the N BBLs and the N SBLs with the corresponding GBLs to generate a reduced GBL voltage. The method further includes multiplying the reduced GBL voltage to be sensed by a latch sense amplifier to latch the corresponding page data to the Page Buffer circuit for storing as digital bits.

The present invention also provides a flow control for a simultaneously Program, Program-Verify, and Read operations. The definition of simultaneously Read operation means the charge and discharge of NAND-String in multiple Blocks in differ Groups are performed on the same time. The read data from the selected Blocks is dumped to PB one by one. But due to the dump data from a selected page into PB is much faster than the time used for discharging the selected BBLs lines in accordance with the stored page buffer, the operation of multiple-WL and All-WL Read and Program is like simultaneous Read.

4. BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

Figure 3A:
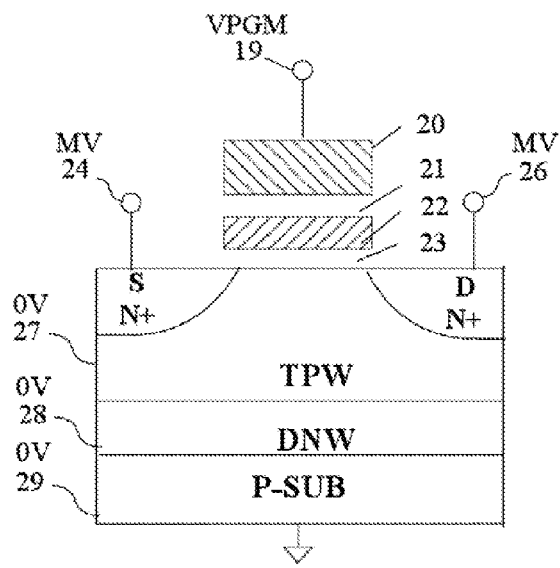

FIG. 3A shows a cross-sectional view of a 2-poly, NMOS, HiNAND memory cell with Program-Inhibit bias condition according to an embodiment of the present invention. The 2-poly, NMOS, HiNAND memory cell is formed inside a Triple P-Well within a Deep N-Well on top of a P-substrate. This HiNAND cell is preferably using non-Self-Boosting Program-Inhibit scheme to prevent the FN-channel tunneling Program, unlike traditional Self-Boosting (SB) technique commonly used in prior-art NAND.

Figure 3B:
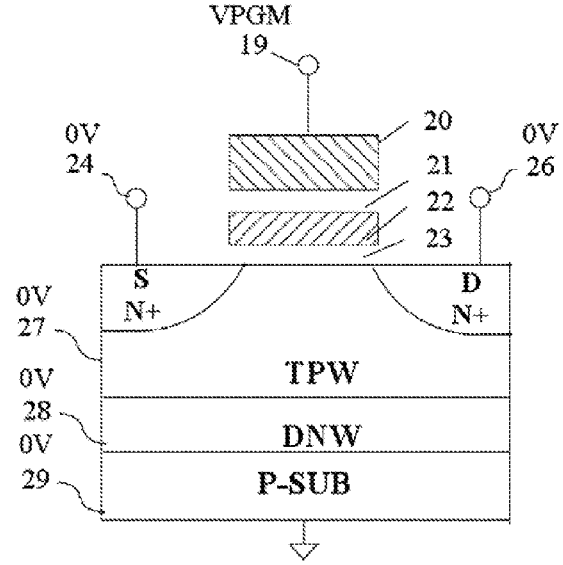
Figure 3C:
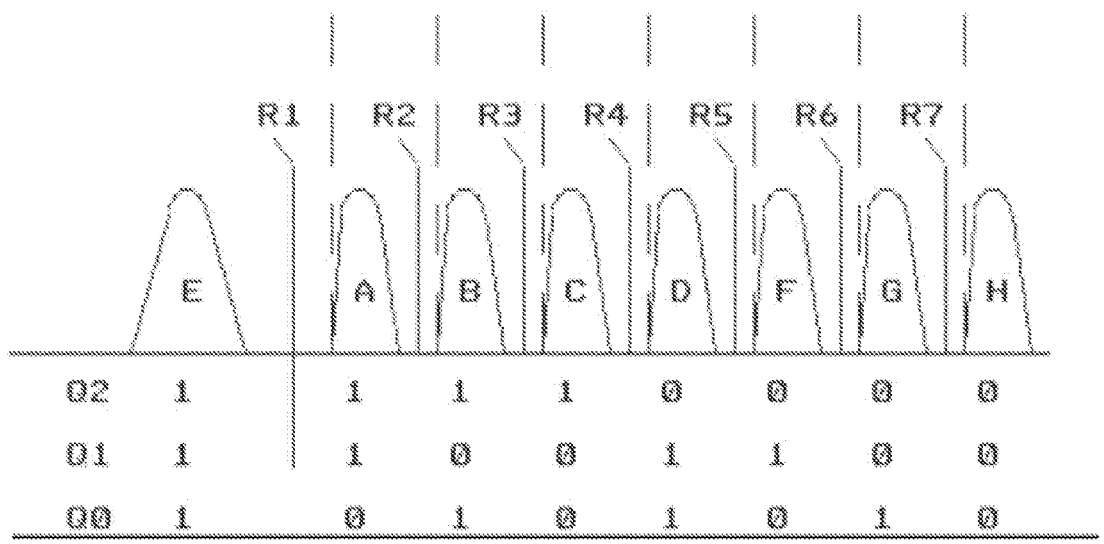

The HiNAND cell's preferred non-SB Program-Inhibit bias voltage conditions are summarized below. No Program operation happens, thus NAND cell's Vt<−0.7V at an erased state.
  a) Vg=Vpgm=15V-25V
  b) Vs=Vd=MV≥7V
  c) $V_{TPW}$=0V
  d) $V_{DNW}$=Vdd
  e) Vp-sub=0V FIG. 3B shows preferred Program bias conditions according to an embodiment of the present invention. After Program, NAND cell's Vt is increased from erased-state Vt to program states such as 3 A, B, C states with positive Vt for one MLC cell or 7 positive Vt states for one TLC cell and 15 positive Vt states for one XLC cell.
  a) Vg=Vpgm=15V-25V
  b) Vs=Vd=0V
  c) $V_{TPW}$=0V
  d) $V_{DNW}$=Vdd
  e) Vp-sub=0V FIG. 3C shows eight regular Vt distributions of one TLC HiNAND cell with eight binary state assignments of 111, 110, 101, 100, 011, 010, 001 and 000 for respective E, A, B, C, D, F, G and H states from left to right according to an embodiment of the present invention. Many other 8 TLC state assignments can also be accepted for this HiNAND cell and array.

Figure 3D:
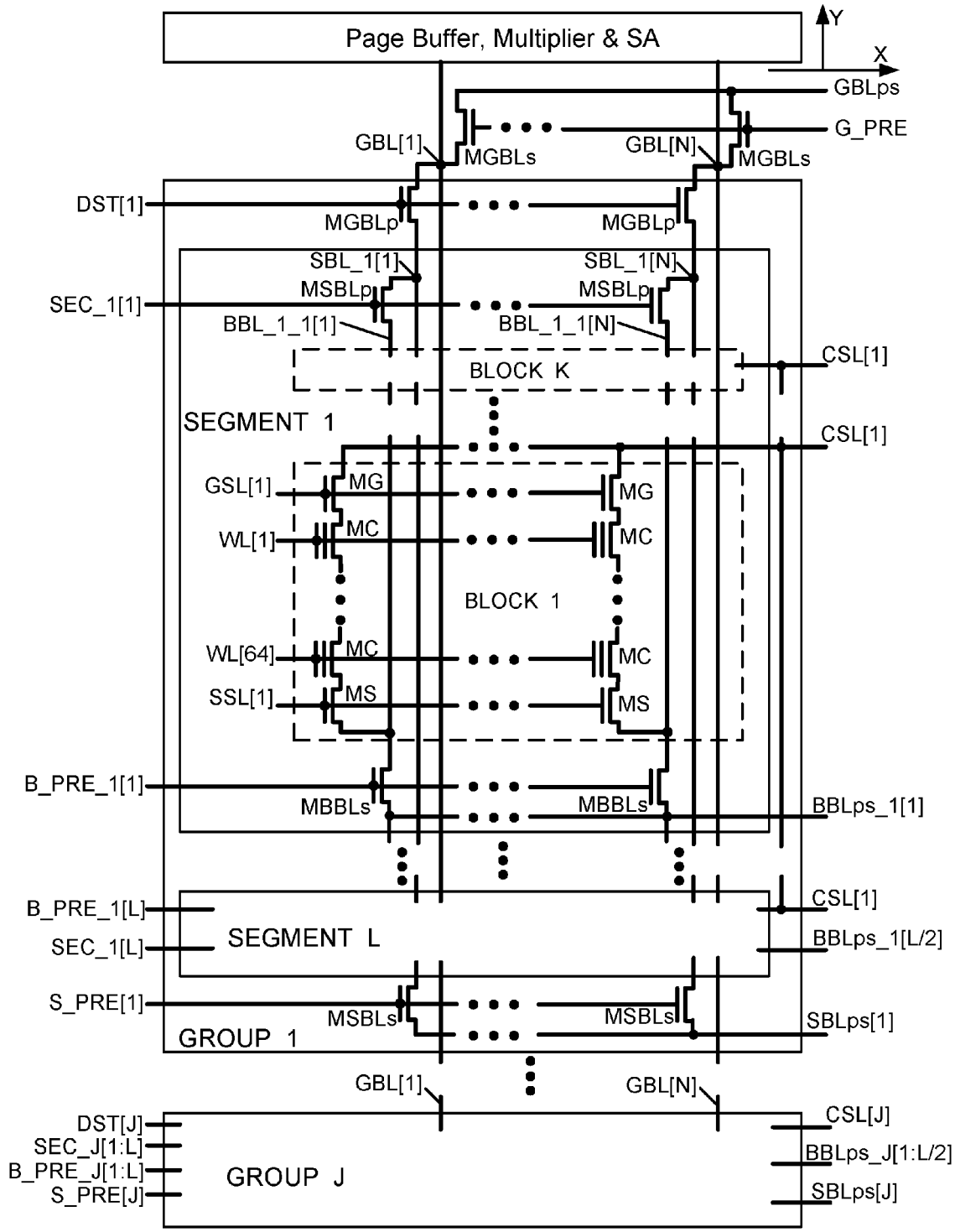

FIG. 3D shows a preferred HiNAND3 array with 3-level BL-hierarchical structure according to a specific embodiment of the present invention. The HiNAND3 array preferably comprises J HiNAND Groups such as Group 1 to Group J. Each HiNAND Group further preferably comprises L HiNAND Segments such as Segment 1 to Segment L. Furthermore, each HiNAND Segment preferably comprises K NAND Blocks such as Block 1 to Block K. Each HiNAND Block further comprises a plurality of regular NAND Strings. Each NAND String comprises N NAND cells connected in series with one top String-select transistor MS and one bottom String-select transistor MG.

All J NAND Groups comprise N long and heavy GBL metal3 lines such as GBL[1] to GBL[N] laid in parallel to each other in Y-direction and coupled directly to N outputs of a top circuit block comprising of Page Buffer (PB), Multiplier, and Sense Amplifier (SA). Each GBL metal3 line is further divided into J SBL metal2 lines (in other words, for the HiNAND array with total J Groups, each Group is divided into L Segments), for example SBL_1[1] through SBL_1[N] for Segment 1. Each SBL_L[N] is also laid in the Y-direction from Segment1 to Segment L within each HiNAND Group. Each SBL metal2 line is further divided into K BBL metal1 line such as BBL_1_1[1] to BBL_1_K[1] also laid in the Y-direction within the HiNAND Segment 1. In addition, each GBL, SBL and BBL line is respectively associated with one NMOS device connected to a corresponding power line such as GBLps, SBLps and BBLps, laid in X-direction (perpendicular to the Y-direction). These NMOS devices include MGBLs, MSBLs and MBBLs. Each GBL, SBL, and BBL line also is associated with another NMOS device connected between BLs in different levels. These devices include MGBLp and MSBLp.

Figure 4:
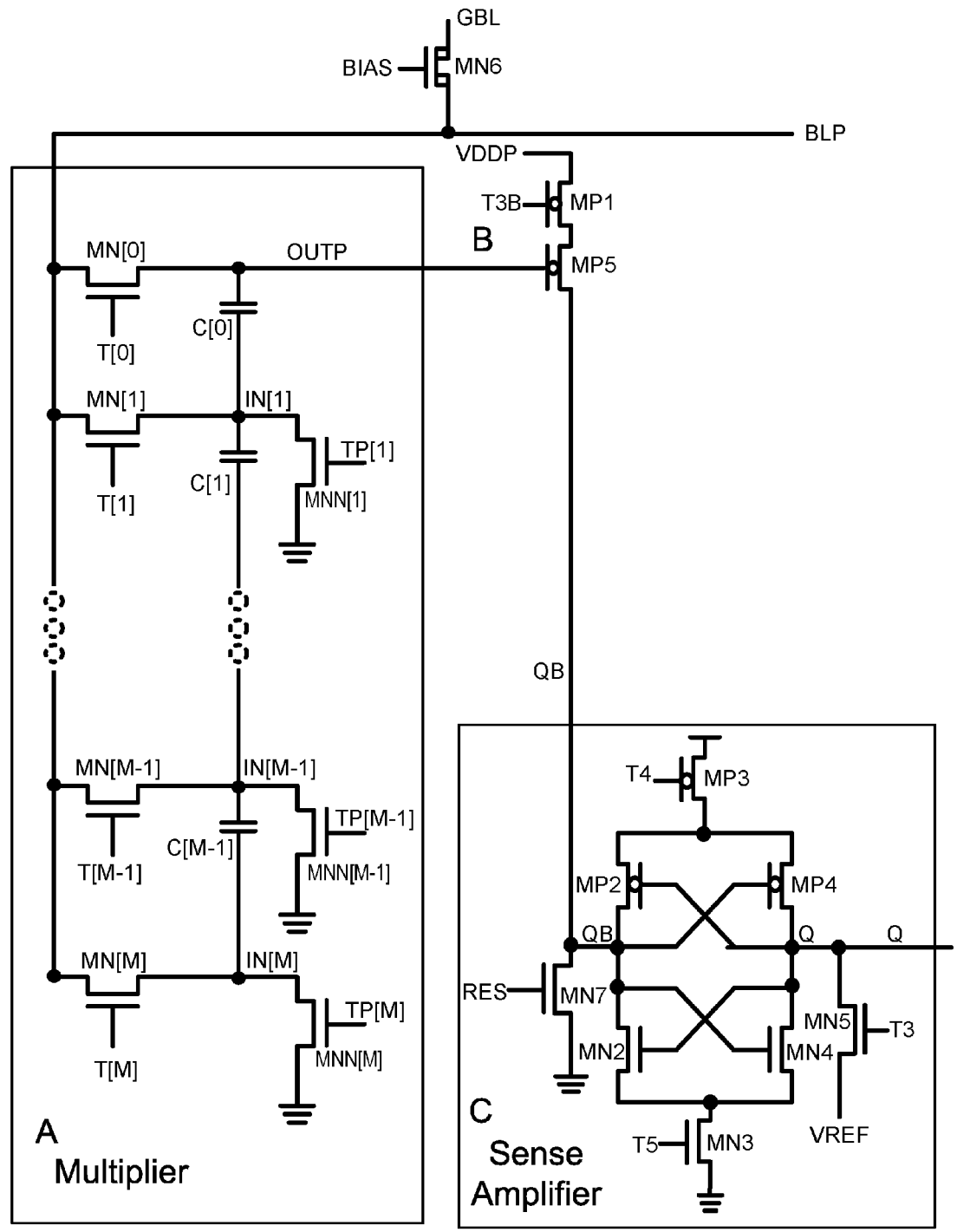

FIG. 4 shows preferred circuits of one Multiplier, one Latch-SA and one Connector circuit inserted in between the Multiplier and the Latch-SA circuit per GBL according to an embodiment the present invention. Unlike the conventional NAND scheme, each GBL of the present invention is not directly connected to the Latch-SA. Instead, each GBL is connected to its associated Multiplier first via one dedicated 20V NMOS device with its gate tied to a BIAS signal and its source coupled to a BLP signal. The output of the Connector circuit is coupled to one input of the Latch-SA with another input connected to a reference VREF signal.

FIG. 5 shows a table that contains a preferred set of bias voltage conditions for a preferred Multiple-WL & All-BL Read operation for the preferred HiNAND array according to embodiments of the present invention. Each WL or Page of this preferred Multiple-WL Read operation uses an All-BL Read scheme to achieve less WL disturbance, less latency and lower power-consumption. Thereby, a longer Read endurance cycle is accomplished.

FIG. 6 shows a table that contains a preferred set of bias voltage conditions for a preferred Multiple-WL & All-BL Program and Program-Inhibit operations for the preferred HiNAND array according to embodiments of the present invention to achieve less WL disturbance, less latency and lower power-consumption. Thereby, a longer Program endurance cycle is accomplished.

FIG. 7 shows a table that contains a preferred set of bias voltage condition for one selected WL and unselected WLs for the preferred Multiple-WL and All-BL Program and Program-Inhibit operations according to embodiments of the present invention without using any Self-Boosting Program Inhibit schemes for superior Program and Program-Inhibit operations with longer P/E endurance cycles.

5. DETAILED DESCRIPTION OF THE INVENTION

In the following detailed description, numerous specific details are set forth in order to provide a more thorough understanding of the present invention. The detailed description of the present invention, reference is made towards the accompanying drawings, flows and tables that form a part hereof and in which is shown, by way of illustration, specific embodiments in which the invention may be practiced. In the drawings, like numbers describe substantially similar components throughout the several views and embodiments. These embodiments are described in sufficient detail with a goal to enable those skilled in the art to practice the invention. Other embodiments may be made without departing from the scope of the present invention. The following detailed description is not to be taken in a limiting sense, and the scope of the present invention is defined only by the appended claims and equivalents thereof. In other instances, well-known structures and devices are shown in block diagram form, rather than in detail, in order to avoid obscuring the present invention.

Please note, if used, the labels left, right, top, bottom, middle, higher or lower level X or Y-direction, column or row direction, horizontal or vertical direction, have been used for convenience purposes only and are not intended to imply any particular fixed direction. Numerical denotation using J, L, K, M, N, m, n, is also for convenience purpose and corresponding examples of these numbers, such as 1, 2, 3, 8, 16, 32, 64, 256, etc are not intended to limit the scope of the present invention defined by the appended claims. Instead, they are used to reflect relative locations and/or directions between various portions of a circuit object or schematic diagram.

Unlike conventional NAND having only one-level metal bit line (BL) architecture, in general, the HiNAND array of the present invention includes a novel NAND cell array including a multiple-BL metal line hierarchical structure with at least 2 levels. Each local BL metal line in one level is preferably connected to one pull-up NMOS divided BL-select device and one pull-down NMOS device which couples to a common SL (sourceline). Each pull-up NMOS divided BL-select device is used as bridge to connect the BL metal line on top level to the BL metal line on bottom level. For example, 3-level BL-hierarchical metal lines in a HiNAND3 array will be explained with reference to FIG. 3D. Three levels of the BL hierarchical structures mean that the top global BL (GBL) layer uses metal3 line, the middle Segment BL (SBL) layer uses metal2 line located at 1-level lower than the top GBL metal3 line, and lastly the Block BL (BBL) level uses metal1 line laid at 2-level lower than the top GBL metal3 line but at 1-level lower than the middle SBL metal2 line. Note, HiNAND3 stands for a HiNAND array with a 3-level BL-hierarchy in the present invention. Similarly, HiNAND2 stands for a HiNAND array with a 2-level BL-hierarchy in the present invention. The conventional NAND is like HiNAND1 with just one-level BL-hierarchy in the present invention. Note, all GBLs, SBLs, and BBLs are using metal0 layer for connecting corresponding common source line in X-direction across the whole HiNAND plane and array.

For a HiNAND3 array architecture, from electric circuit viewpoint, each column of GBL of HiNAND3 array is preferably divided into 3 levels of divided BLs. In particular, the HiNAND array is divided into J Groups. Each Group is then further divided into L Segments. Lastly, each Segment is further divided into K Blocks arranged in Y-direction. Similar as the conventional NAND, each column of the HiNAND Block comprises a NAND String having M NAND cells connected in series which is sandwiched by a top String-select NMOS transistor and a bottom String-select NMOS transistor. The values of M can be 16, 32, 64, 128 or any other arbitrary integer number.

Unlike the conventional NAND with only 1-level BL decoder, a 3-level BL decoder including a top Group-decoder, a middle Segment-decoder and a bottom Block-decoder is required in the HiNAND3 array of the present invention. Similarly, a 2-level BL decoder including a Segment-decoder and a Block-decoder is required for the HiNAND2 array of the present invention. Now the operations and associated devices of each BL metal layer are explained below in accordance with the HiNAND array circuit shown in FIG. 3D.

Referring FIG. 3D, in a HiNAND3 array, each GBL is connected to one NMOS device, MGBLs, with two purposes from circuit viewpoint as explained below.

1) GBL: Global Bit Line. The GBL has largest BL capacitance, $C_{GBL}$, laid out over the corresponding SBL (Segment Bit Line).

a) This is the top metal3 line that is used to connect J NAND Groups in Y-direction within 2λ x-pitch. The length of this metal3 GBL extends from HiNAND3 array top to the HiNAND3 array bottom. This is the longest metal BL in HiNAND3 array, laying in the Y-direction and is perpendicular to WLs in X-direction.

b) MGBLs: This NMOS device has to sustain a $V_{Inhibit}$ voltage as a String-select transistor. The drain node of MGBLs is connected to each GBL in the Y-direction. The source node of MGBLs is connected to one corresponding GBLps in the X-direction perpendicular to the Y-direction.

c) The GBLps line uses metal0 line. If GBLps=Vss, then it is used as a Vss source line. If GBLps equals a VH voltage, then it is used as Power SL line. The VH voltage is either Vdd or greater than Vdd.

d) In other words, only one MGBLs device per one GBL metal3 line.

2) SBL: Segment Bit Line. The SBL has second largest BL capacitance, $C_{SBL}$. $C_{SBL} \leq 1/10$ of $C_{GBL}$, assuming HiNAND array is divided into J=10 Groups. The exact capacitance ratio, $Cr1=C_{SBL}/C_{GBL}$ is flexible, depending on the area and power-consumption tradeoff of the preferred value of the BL-charge sharing between $C_{SBL}$ and $C_{GBL}$.

a) This is the middle metal2 BL that is used to connect the L HiNAND3 Segments in the Y-direction within 2λ x-pitch. The length of this SBL metal2 line within each HiNAND Group extends from the Group top to the Group bottom. This is the second longest metal BL in HiNAND3 array, laying out in the Y-direction and is also perpendicular to WLs.

b) MSBLp: This NMOS device also has to sustain a $V_{Inhibit}$ voltage as the String-select transistor. The drain node of MSBLp is connected to each corresponding GBL. The source node of MSBLp is connected to one corresponding SBL metal2 line.

c) MSBLs: This NMOS device also has to sustain a $V_{Inhibit}$ voltage as the String-select transistor. The source node of MSBLs is connected to each corresponding metal0 line, SBLps. The drain node of MSBLs is connected to the corresponding SBL metal2 line.

d) The SBLps line uses metal0 line. If SBLps=Vss, then it is used as a Vss SL line. If SBLps equals a VH voltage, then it is used as Power SL line. The VH voltage is either Vdd or greater than Vdd.

e) In other words, only one MSBLs and one MSBLp devices per one SBL metal2 line.

3) BBL: Block Bit Line. The BBL has the smallest BL capacitance, $C_{BBL}$. Typically, $C_{BBL}<1/10$ of $C_{SBL}$, assuming each Segment is divided into 10 Blocks. The exact capacitance ratio, $Cr2=C_{BBL}/C_{SBL}$ is flexible, depending on the area and power-consumption tradeoff of the preferred value of the BL-charge sharing between $C_{SBL}$ and $C_{BBL}$.

a) This is the bottom metal1 BL that is used to connect the K HiNAND3 Blocks in the Y-direction within 2λ x-pitch. The length of this metal1 BBL within each Segment extends from the HiNAND3 Segment top to the HiNAND3 Segment bottom. This is the shortest metal BL in the HiNAND3 array, laying out in the Y-direction and is also perpendicular to WLs.

b) MBBLp: This NMOS device also has to sustain $V_{Inhibit}$ voltage as the String-select transistor. The drain node of MBBLp is connected to each corresponding vertical SBL metal2 line. The source node of MBBLp is connected to one corresponding BBL metal1 line.

c) MBBLs: This NMOS device also has to sustain $V_{Inhibit}$ voltage as the String-select transistor. The source node of MBBLs is connected to each corresponding metal0 line, BBLps (which can be mirrorly shared by two neighboring Segments). The drain node of MSBLs is connected to the corresponding BBL metal1 line.

d) The BBLps line uses metal0 line. If BBLps=Vss, then it is used as a Vss SL line. If BBLps equals a VH voltage, then it is used as Power SL line. The VH voltage is either Vdd or greater than Vdd.

e) In other words, only one MBBLp device and one MBBLs device per one BBL metal1 line.

For a HiNAND2 array architecture of the present invention, there are only 2-level BL, thus only two metal lines of metal2 and metal1 are used without using any metal3 line as seen in HiNAND3 array. In the HiNAND2 array, the NAND Group is not needed. The metal2 line becomes GBL and metal1 line becomes SBL. In other words, SBL is upgraded to GBL, while the BBL is upgraded into SBL. The corresponding NMOS devices MSBL and MBBL assignments are the same as HiNAND3. Therefore, the detailed description would be skipped here for simplicity for those skilled in NAND architecture.

Now, the reason why the new HiNAND proposes to use tight multiple-metal BL lines than NAND's 1-metal BL will be explained below. From the conventional NAND design wisdom, requirements of multiple tight metal BL lines in HiNAND array of the present invention will increase NAND manufacturing process steps and the die cost. Therefore, in past 25 years, the 1-metal BL scheme in NAND array prevailed and has become the thumb of rule of design in NAND since its first product debut in 1988. But NAND density so far has been increased from the initial 1 Mb in 1988 to 256 Gb in 2013. In other words, the NAND density has been increased by about 1 million-fold. In next 10 years, the NAND density will be potentially increased beyond 1 Tb or even beyond 10 Tb per die by using a new 3D NAND flash technology.

In a conventional 1-level metal BL NAND array, the fastest Program operation can only be executed at most in unit of one physical WL or page in 1-cycle at a time. But today, when NAND technology feature size migrates toward below 2×nm, one physical WL program is even being divided into a slower but safer 2-cycle Odd/Even logic WL program due to severe proximity-effect of coupling noise between BL-BL and WL-WL. Even for NAND Read operation ALL-BL 1-cycle faster Read has appeared in some NAND flash designs, the Odd/Even 2-cycle slower Read is still being used in most NAND design for safe data quality.

Although the NAND design scheme is shifting from 2-cycle Odd/Even to 1-cycle ALL-BL faster Read and Program operations, the 1-cycle access speed is still not fast enough to be in line with the million-fold or thousand-fold density increase in NAND flash memory.

In other words, the 25-year conventional NAND design, a need of dramatic read and program speed improvements to accommodate for the NAND memory increase is urgently needed. The present invention shows that unless the conventional NAND one-WL in one Block Program scheme can be replaced by multiple-WL Program in different Blocks, otherwise, the Program speed has hit a wall for NAND, regardless of 2D or 3D architectures.

Similarly, to dramatically increase the speed of the conventional 1-WL Read scheme in the conventional NAND, a method of multiple-WL Read in multiple Segments is the key solution. As disclosed throughout the specification, we discovered the bottleneck to using multiple-WL Read and Program, which is because the conventional NAND uses only one-level metal BL. The one-level metal BL is shared by all Strings in all Blocks in a column of the NAND array. The plurality of all one-level metal GBLs is coupled to a top Page Buffer (PB) that stores the incoming data to be written into the NAND cells in the selected page or WL of the selected Block.

In ALL-BL Program, all GBL voltages are coupled to the outputs of PB. If the data of corresponding bits of PB is "0", then the corresponding GBLs are coupled to Vss for Program operation and the cells' Vt would be increased from initial erased E state with a negative-Vt value into the positive-Vt value of programmed states such as A, B and C states. If the data bit of PB is "1", then the corresponding GBLs are coupled with Vdd for Program-Inhibit operation. A typical SLC Program time takes about 20μS. During this 20 μS page program time, all GBLs are filled with either Vss or Vdd dedicated for NAND cells of one selected WL or page. To write another page, the GBLs' voltages will be filled with another data pattern of Vss and Vdd. Every page of data is different in GBL so that two or more data patterns cannot be sent to same GBLs simultaneously for multiple Program operations.

In other words, multiple-Program bottleneck is not due to the lack of multiple-WL selection in different Blocks but due to the inexcusable multiple data patterns coupled to single GBL metal lines because existing one-level GBL can only take one data pattern at a time without having data contention in GBLs. The WL is not an issue, why? According to today's NAND Program operation, the page program sequence starts from WL[1] at the bottom page and ends at the last page or WL on the top of the NAND String.

Therefore, for multiple WL Program in different Block, multiple WLs in the same location of the same selected page of the same selected Block can be programmed simultaneously with N-fold faster program time if N WLs in N different Blocks of HiNAND are selected for simultaneous program. Since the selected WLs are in the same locations of the selected string of the selected Block, thus the current Block decoder circuit does not need modifications but let each latch of each Block decoder be flexibly set or reset. That means the best case is to allow the each latch of each Block decoder be flexibly set and reset so that the multiple set and reset can be easily implemented in multiple Block decoders to allow multiple simultaneous program. In this way, all selected WLs of the selected Blocks are directly accessed by the central String-select decoders.

If the NAND String contains 32-WLs without dummy WLs, then the address combinational logic and voltages of total 32 WLs and 2 String-select lines are directly provided from Central Block decoders. The one Vpgm (15V-25V) and 31 Vpass (8-10V) of HV and Vdd or Vss of two String control signals are generated and controlled by this central Block decoder. The program timing and waveforms are same as the conventional NAND with one Block select control only by the on-chip State-machine circuit.

In summary, the desired multiple Program operation requires multiple selections of 32 WLs and 2 String-select lines in same logic and voltage controlled by the on-chip State-machine. With all Block decoder's latches being preferably changed to allow the multiple set and reset, then the implementation of multiple selections of 32 WLs plus 2

String-select signals with same voltages can be easily set up as the conventional NAND's State-machine circuit without change.

Now, the only issue left to solve for achieving multiple simultaneous programs on multiple Blocks of HiNAND is how to provide the multiple unique (different) Program voltage (Vss) and Program-Inhibit voltage of $V_{Inhibit}$ to corresponding GBLs determined by the LV PB in HiNAND array. In a first embodiment, the $V_{Inhibit} \geq 7V$ and in a second embodiment $V_{Inhibit}=Vdd$.

Note, in order to save the program power-consumption, the first embodiment of $V_{Inhibit} \geq 7V$ cannot be generated and coupled to the targeted multiple SBLs or BBLs from the top LV PB because the conventional LV GBL-PB with latches cannot generate a HV of 7V. Even the LV GBL-PB is changed to a HV GBL-PB, the 7V coupled to long and big GBL takes too much power consumption and it is against the green-memory design spirit because total GBL capacitance value for 256 Gb NAND can reach up to M×nF, where M>100 easily. In this new HiNAND array, the HV 7V $V_{Inhibit}$ voltage is supplied from the selected single BBLs. Since the capacitance of BBL is much smaller than the capacitance of GBL, thus the power consumption of $V_{Inhibit} \geq 7V$ to the selected BBL metal lines can be dramatically reduced by more than 100-fold. Of course, there can be many variations, alternatives, and modifications. The detailed explanation will be described in subsequent pages of this application.

Obviously, the conventional architecture of 1-level metal line GBL with latches along with only one LV PB is not implementable to allow multiple unique or different page data with the program voltages of Vss and $V_{Inhibit}$ voltage of Vdd being sent to the multiple destinations of the selected NAND cells' channels on the selected WLs in the multiple selected Strings of the multiple selected Blocks in the conventional NAND array.

The present HiNAND inventions solve the above problems by adding 1 or 2 divided BL metal line capacitances to form a 2-level or 3-level BL-hierarchical architecture associated with the multiple-BL-program-voltage-trapping scheme without adding any local latches acting as local pseudo page buffer in BBLs or SBLs, etc.

In an embodiment, a NAND array with a 2-level BL-hierarchical structure with one extra metal2 line for BBL under metal1 line is referred as a HiNAND2 array of the present invention. In another embodiment, a NAND array with a 3-level BL-hierarchical structure with one extra metal2 line for BBL-cap (BBL capacitance) and metal1 line for SBL-cap is referred as HiNAND3 array of the present invention.

There are several factors that determine which NAND array, HiNAND2 or HiNAND3, will be the best choice for the multiple-WL Program? For the present invention, the following factors including page Read, page Verification (Program and Erase), Program, Erase and Read endurance cycles, power-consumption and Read latency are taken into consideration to select HiNAND2 or HiNAND3, as shown in the following Table I.

TABLE I

| Selection | HiNAND2 | HiNNAD3 | comments |
|---|---|---|---|
| Multiple WL Program only | Yes | No | 2-level BL HiNAND2 array m2 for GBL m1 for SBL |
| Multiple WL Program & Multiple Read | No | Yes | 3-level BL HiNAND3 array m3 for GBL m2 for SBL m1 for BBL |
| Self-boosting & large Vpass-WL disturbance | Yes | Yes | |
| No Self-boosting & near zero Vpass-WL disturbance on A, B, C program cells | Yes | Yes | Conventional NAND uses unreliable SB, LSB and EASB Program-Inhibit methods |
| All-BL multiple Program | Yes | Yes | |
| All-BL multiple Read | Yes | Yes | |
| Which BL cap used for local PB for multiple-WL Program? | BBL metal1 | BBL metal2 | For least $V_{Inhibit}$ charges |
| Which BL cap used for optimal multiple-WL Read? | BBL metal1 | SBL metal2 | For optimal charge-sharing Read |

As will be explained and fully understood later, the HiNAND2 array can effectively achieve the same delivery of the desired multiple unique page data from single PB through single GBL metal2 buses to the targeted SBLs metal1 capacitance so that the page data pattern voltages the Vss and $V_{inhibit}$ voltages can be effectively latched at there for a long period of 200 µs program time as if it were from PB. In other words, the local large capacitance of SBLs metal1 line acts as a local SBL-PB without a real latch-circuit for storing the temporary page data that is coupled from GBL-PB.

The traditional NAND's LV PB with a plurality of latches can be used for the HiNAND2 array that act as a role of central LV GBL-PB with latches to store and provide all multiple page data in the form pipe-line temporarily. In other words, this LV GBL-PB with latches is designed intentionally to store only one page data to save silicon area. Definitely, more than one page data latches can be built in this LV GBL-PB circuit for easily pipe-line storage handling to save the down load time from external I/Os to this LV GBL-PB and sequential page-data loading time from LV GBL-PB to multiple targeted SBL-PBs in different multiple Blocks without any latches but SBL capacitance. Note, the definition of LV PB means all latch devices can use LV PMOS and NMOS device except only one connected to GBL used as a HV/LV isolation device that needs to be a 20V thicker-gate voltage for preventing 20V from the triple-Pwell of NAND cell array during Erase operation.

For a HiNAND3 array, there are 2-level BL lines such as metal2 SBLs and then metal1 BBLs. Thus, the lowest of metal1 BBL capacitance, BBL-cap, will replace the middle metal2 SBL capacitance, SBL-cap, as a local PB without any latches to store the page data for multiple-WL or page Program. This is referred as a local pseudo BBL page buffer without latches.

As explained above, the order of BL capacitances among these GBL-cap, SBL-cap, and BBL-cap is defined as below due to the top metal BL layer is always much longer than the BL metal line laid one layer below, thus having higher parasitic metal capacitance including fringe coupling capacitance between two adjacent BLs. The order of values of BL capacitances is: GBLcap>>SBLcap>>BBLcap.

The number of BBL pseudo page buffer can be determined by the tradeoff of HiNAND array size and the $V_{Inhibit}$ charge current of each BBL pseudo page buffer. Note, the above so-called pseudo page buffer does not contain any latches as typical GBL-PB but only capacitance for storing one temporary page data during multiple-page Program operation of the presentation. Also note, the number of required latches per NAND cell of GBL-PB is determined by the desired storage type of NAND cell. For a conventional NAND storage scheme, one latch is minimally required per SLC NAND cell and two latches per one MLC NAND cell, three latches per one TLC cell and four latches per one XLC cell. For a 256-level analog storage, then 8-latch per one analog NAND cell is required.

In theory, the number N of BBL pseudo page buffer allows N multiple pages to be simultaneously programmed associated with only one central GBL-PB. Thus, the N-fold Program time reduction can be achieved. The details of charge-trapping techniques would be explained subsequently again with reference to FIG. 3D and flows of HiNAND3 array circuit.

The selected pages of multiple selected Blocks for simultaneous multiple-WL Program operation with the same requirement of only one shared GBL-PB. The multiple unique pages are supplied one-by-one from one shared N-bit PB on different timing during the BL Program and Program-Inhibit setup period.

Assuming total N-bit of 16 pages or WLs are selected for simultaneous Program, then 16 page N-bit data has to be provided from this single shared N-bit LV PB placed on HiNAND array top. Each N-bit page data are loaded serially into this one LV-PB from external I/O bus in unit of byte or word. But in order to save the sizes of one PB silicon area, only one page data is preferably designed to achieve the smallest and most economic PB design for the HiNAND array of the present invention. Even it is an 1-page PB, the real silicon size of this PB is fully determined by the desired storage types and design techniques. For example, for today's NAND memory, there are more than four storage types such as SLC, MLC, TLC, XLC and analog types. In LV-PB, one latch is used for a SLC NAND cell, 2 latches for a MLC NAD cell, 3 latches for a TLC NAND cell, and 4 latches for an XLC NAND cell storage. Other more latches per NAND cell may be used for other NAND storage functions.

For this HiNAND array of the present invention, one option is to use 4 or more latches per GBL per NAND cell to cover all SLC, MLC, TLC and XLC storages. Even the real HiNAND storage is not XLC, 4 latches per GBL can be used to store 4 bits of page data for the preferred pipe-line Program and Read for less repeat down loading time of serial data from external I/Os to this LV GBL-PB.

In summary, in order to achieve the multiple-WL and All-BL Program and Read operations, a preferred 2-level BL-hierarchical HiNAND2 array or 3-level BL-hierarchical HINAND3 array are proposed to work along with one LV GBL-PB. The lowest BBL-cap is used as the local BBL pseudo page buffer without latches to temporarily store the Vss Program voltage and $V_{Inhibit}$ Program-Inhibit voltage in BBL-cap.

If the $V_{Inhibit}$ voltage=Vdd, Vpgm (BL)=Vss, then the BBL pseudo page buffer stores N-bit of page data with Vss and $V_{Inhibit}$ voltages coupled directly from the LV GBL-PB with latches. If the $V_{Inhibit}$ voltage≥7V, Vpgm (BL)=Vss, then the all N BBLcaps are precharged with $V_{Inhibit}$ voltage initially through one selected BBLps bus running in parallel to WLs for least power consumption. Then GBL-PB supplies the Vss ("0") and Vdd ("1") of page data to all GBLs. All initially precharged 7V BBL lines are then discharged to Vss or retained 7V $V_{Inhibit}$ voltage through a NMOS device MBBLs with its gate tied to Vdd only for next page Program operation.

The above said hierarchical structure of multiple metal-line pseudo page buffers such as BBL pseudo page buffer and SBL pseudo page buffer for simultaneous multiple-WL, All-BL Program and Read operations is still not sufficient. A conventional sensing scheme and program-inhibit voltage for Vpass also need to be changed along for HiNAND memory. All these changes are derived from the NAND device physics and basic operating schemes of the fundamental Read and Program methods used in a conventional NAND array. All these preferred changes in NAND array, PB, and program-biased condition and no Self-Boosting Program-Inhibit methods are aimed to dramatically reduce the current, disturb of both Read and Program operations. Besides, the Read and Program speed can be improved more than 10-fold and even 100-fold for this novel HiNAND flash memory. For either NAND or HiNAND design, the major peripheral circuits include the Page Buffer, WL-decoders, BL-decoders, SL-decoders and Segment decoders, sense amplifier, the high-voltage (HV) pump circuits for respective Read, Program, and Erase operations and the on-chip state-machine that automatically controls the defined timings, waveforms, voltages and sequences of key operations such as Erase, Erase-Verify, Program, Program-Verify, and Read operations.

Figure 1:
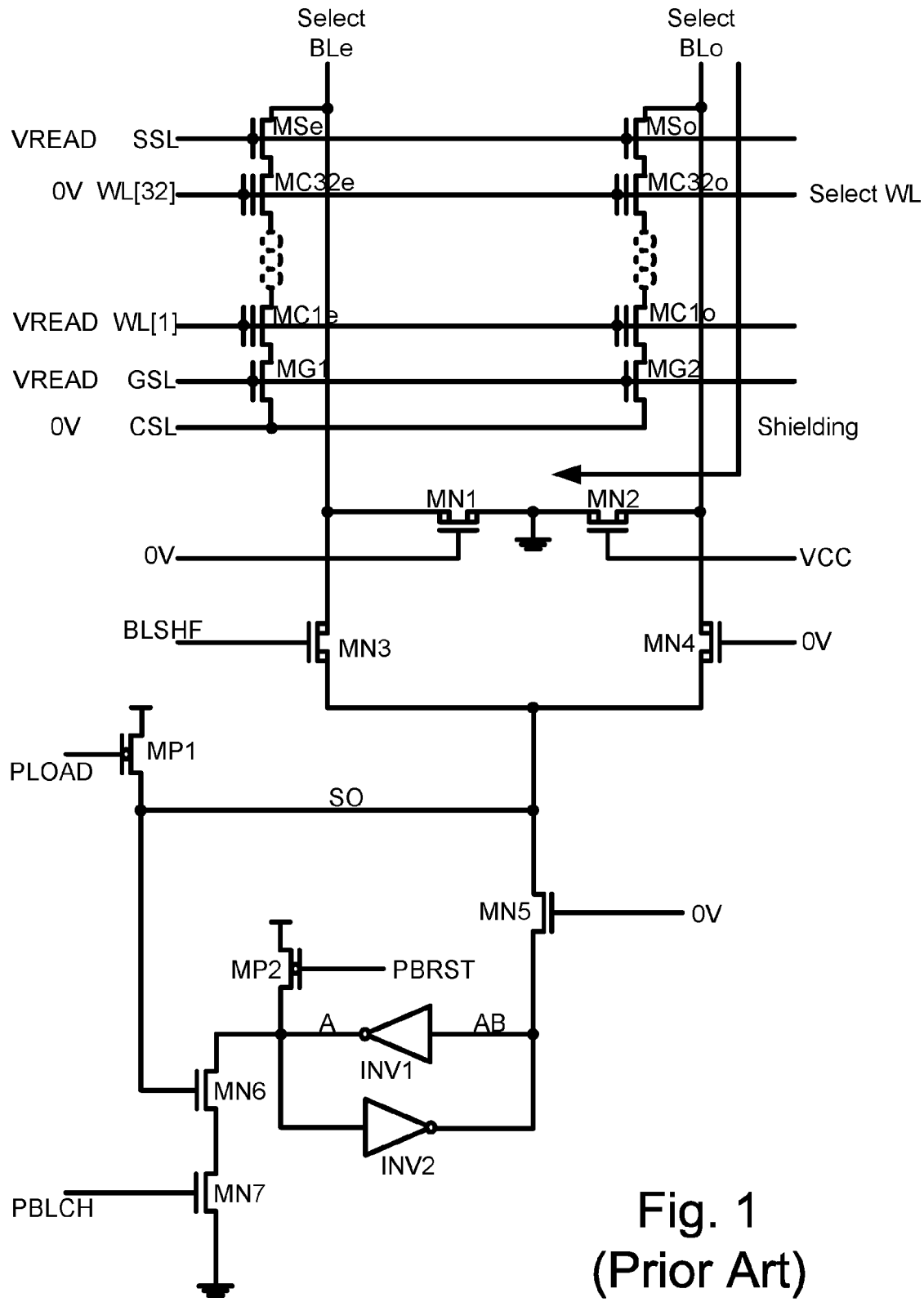
FIG. 1 shows a typical NAND array with one portion of Block and one Sense Amplifier (SA) shared by one paired NAND Strings including one Odd String with its drain node coupled to BLo metal bit line and one Even String with its drain node coupled to another BLe metal line.

In order to illustrate many advantages of the present invention, a detailed operation of the conventional NAND will be explained further via FIG. 1 based on an exemplary circuit of NAND array and sense amplifier from June Lee et al., "A 90-nm CMOS 1.8-V 2-Gb NAND Flash Memory for Mass Storage Applications," IEEE J Solid-State Circuits, vol. 38, No. 11, November 2003, pp. 1934-1942. The NAND array only shows two BLs that are divided into one paired lines of BLo in right and BLe in left. The BLo stands for Odd BL, while BLe stands for Even BL. The whole NAND array is being divided into two BL groups with equal number of BLs such as all Odd BLs and all Even BLs. In the simplified version of NAND, FIG. 1 shows that each BLe line only one NAND String is connected to it. Similarly, in each BLo line, only another one NAND String is connected to it. In real NAND design, each BLo line or BLe line has connected to a plurality of NAND strings.

In FIG. 1, each NAND String has 32 NAND cells, for example, MC1o-MC32o in BLo, MC1e-MC32e in BLe. The 32 NAND cells are connected in series with one top String-BL-select transistor such as MS1 coupled to BLe and MS2 coupled to BLo, with their gates tied to a common signal of SSL and one bottom String-SL-select transistor such as, MG1 and MG2, with their gates tied to another common signal denoted as GSL and the String's source nodes are connected to a common SL, denoted as CSL. Note, all MS1, MS2, MG1 and MG2 transistors are a MHV NMOS 1-poly devices that must sustain the String Program-Inhibit voltage across their respective Vds of around 7V during the self-boosting coupling effect commonly used in NAND FN-tunneling page Program operation. The number of NAND transistors in each NAND String can be 16, 64, 128 or any arbitrary integer number. And the NAND storage types can be SLC, MLC, TLC, XLC or analog, depending on the applications and data reliability requirements. Note, for mere convenience of explaining the differences of NAND and HiNAND arrays, here 32T NAND String is used in FIG. 1 but although any other integer numbers can be used without unduly limit the scope of the claims.

In the following sections, explanations of key operations of the conventional NAND are referenced to both FIG. 1 and FIG. 2. These key operations include Program, Program-Verify, and Read operations. Particularly, the Read operation would be explained in more details. In other words, for a regular NAND Read operation, the selected NAND cells in a selected page are assumed being programmed already with different Vtn state before Read. This Vtn are defined differently in different storage types such as SLC, MLC, TLC, XLC or analogue storages. All those conventional Program and Erase schemes and methods can still be used here. But instead, because Program-Verify and Erase-Verify are like Read operation, thus they can be replaced by the Read circuits and techniques disclosed here as for the purpose of reducing current, disturbance and latency.

In FIG. 1, each NAND BL has added one 20V high voltage (HV) NMOS device as a HV buffer to protect each corresponding LV latch-type SA (sense amplifier) from being damaged during the 20V Erase operation. These HV NMOS devices are MN3 and MN1 for BLe and MN2 and MN4 for BLo. Since these 20V HV buffer devices have to sustain more than 20V Vds punch-through and to fit in a very tight pitch of each BL in NAND array such as 19 nm width made of 20 nm NAND node but the channel length of these devices are made more than 0.5 µm. As a result, these HV NMOS transistors are associated with a device width/channel ratio ~25, thus have very high resistance and large silicon area and definitely are not good for BL precharge operation during the first cycle of NAND Read operation.

Referring to FIG. 1, the BL precharge current path is flowing from a PMOS device, MP20, through a common node of SO and split into two paths. FIG. 1 further shows that a first precharged current path is through MN3 to precharge BLe with BLSHF signal coupled to a voltage higher than MN3's Vt and the gates of MN1 and MN4 being grounded in a shut-off state. Conversely, a second precharge current path is through MN4 with its gate coupled to similar BLSHF signal on MN3 into a conduction state to precharge BLo's big capacitance with MN3 held in shut-off state by grounding BLSHF signal.

Although, the gate voltage of both MN3 and MN4 can be increased to a higher voltage during each BL precharge cycle to reduce the conduction resistance, the full passage of Vdd from node SO supplied by a PMOS device, MP1, results in many disadvantages. For example, all Odd and Even BLs, BLo and BLe, in prior-art NAND array would be pre-charged to a highest value of Vdd for the initial $V_{BL}$. That would result in the highest BL pre-charge current and the slowest discharge speed, thus the slowest read latency and largest Read-induced WL-disturbance due to the longest discharge time. All these disadvantages are against today's low-power and low-disturbance green NAND design practice. Thus, it is desired to reduce the charged $V_{BL}$ voltages of BLe and BLo below Vdd with a value of around 0.9V for a reliable sensing margin as well as current reduction.

During the precharge cycles in Read, Program-Verify, and Erase-Verify operations, the gate signal, PLOAD, of MP1 is grounded to fully turn on the PMOS MP1 device. The node of SO would be precharged to Vdd value to fully turn on the gate of NMOS device, MN6, along with MN5 and MN7 NMOS devices all in a shut-off state because the gates of MN5 and MN7 are grounded. In order to limit the $V_{BL}$=0.9V at BLo and BLe with SO=Vdd, the gate voltage of 20V devices of MN3 and MN4 have to be clamped at a voltage, $V_{BLSHF}$=0.9V+Vt, where Vt is the threshold voltage of either MN3 or MN4. Traditionally, signal $V_{BLSHF}$ is set to a value of 2.1V. That proves the Vt value being tuned to be 1.2V for both 20V NMOS enhancement devices MN3 and MN4.

In order to ensure the precharge current flow from MP1 to BLe without leakage, the 20V HV device MN4 along the current path has to be kept in shut-off high-impedance state with gate tied to ground as seen in FIG. 1. BLe is the selected BL in ½-BL Read in the NAND array. Conversely, for the non-select BLo, it is pulled to ground through MN2 device with its gate coupled to Vdd voltage. If Vdd is 1.8V, MN2 gate of 1.8V is still higher than its Vt of 1.2V, thus BLo is set to 0V. That means during the ½-BLs Read scheme, the half of non-selected BLs would not endure the high BL precharge current but at expense of high WL-disturbance.

On the contrary, if BLo becomes the selected BL, then BLo=0.9V but BLe=0V as the un-selected BL. In some other conventional applications, the node between 0V HV devices of MN1 and MN2 are tied to Vdd. That means the $V_{BL}$ of non-selected BLs are set to be Vdd, instead of Vss, for avoiding WL-disturbance by self-boosting effect as Program operation but at expense of adding precharge high current in half of BLs. The details can refer to many prior-art NAND designs.

In conclusion, the conventional NAND Read operation has the following drawbacks:
1) It is not an ALL-BL 1-cycle one full physical-page Read scheme: Thus the Read latency is 2-fold (2×) slower because reading one whole physical page needs two cycles. The first cycle is to read the Odd page and the second cycle is to read Even page or vise versa.
   a) It consumes averaged 1.5-fold (1.5×) BL precharge current due to 2-cycle Read: It is due to when reading first ½-page BLe lines, it still needs to precharge whole BLe lines and whole BLo lines to avoid Read-induced WL stress happening on the BLo lines. After reading NAND cells in all BLe lines, all BLe lines may be discharged to Vss if all cells stores the same Vt. Then, when the second cycle moves to read all BLo lines, all BLe lines still need to be pre-charged again but not BLo lines because they are still in precharged state done in the first cycle. As a result, total BLo and BLe being precharged 1.5×.
   b) 2-cycle Read suffers 2-fold Read-induced Vpass(6V) WL disturbance: It is because each ½-page Read, all 32 WLs have to be coupled with Vpass of 6V for 31 times during the whole 32T NAND string read course. Regardless BLo or BLe read, 2-cycle Read will suffer 2-fold stress, thus shorter lifespan.
   c) Precharge and discharge of BLo and BLe is too slow because it has to go through 20V devices of MN3 and MN4.
2) It is not an All-BL physical-page Program scheme.
3) It cannot perform multiple-WL Program and Read operations. Therefore, the Program and Read operation latency is getting worse when NAND memory density is reaching above 256 Gb when NAND technology migrates down to below 2×nm node.

Additionally, the function of the conventional NAND Latch SA and storage circuit will be explained below in accordance with the waveforms and time lines shown in FIG. 2. The Latch SA circuit is comprised of two LV CMOS Inverters INV1 and INV2. Before the precharge cycle, the Latch has to be reset to high at node A by turning on the LV PMOS device MP2 with LV NMOS device MN7 biased in off-state by grounding PBLCH signal so that no leakage path from node A to Vss through LV NMOS devices MN6 and MN7 as seen in FIG. 1.

After precharge-cycle, if the selected NAND cell's Vt is higher than a Read/Verify voltage $V_{RD}$, then there is no conduction current flow though the selected NAND cell in the selected BLe. As a result, the initial precharge voltage at SO still retins Vdd and the selected BLe retains 0.9V, e.g., SO=Vdd and BLe=0.9V. Thus when PBLCH signal switches from Vss to Vdd, the node A will be pulled down to Vss to flip the Latch state because both MN6 and MN7 are biased in a conduction state. The sum of the effective pull-down resistance of two LV NMOS devices, MN6 and MN7, is made smaller than the pull-up resistance of the PMOS device MP1. Conversely, if the selected NAND cell's Vt is smaller than $V_{RD}$, then the NAND cell will conduct the current to pull down BLe's precharge voltage of 0.9V to ground because MP1 is in off-state and cannot hold SO voltage at Vdd again. As a result, the MN6 will be in shut-off state because its gate $V_{SO}$=0V. Therefore, node A still stays at Vdd and NAND cell Vt is detected to be higher than $V_{RD}$. In SLC storage, only one $V_{RD}$ value is used. In MLC storage, there are three $V_{RD}$ values to be determined from three steps of three WL's voltages.

Figure 2:
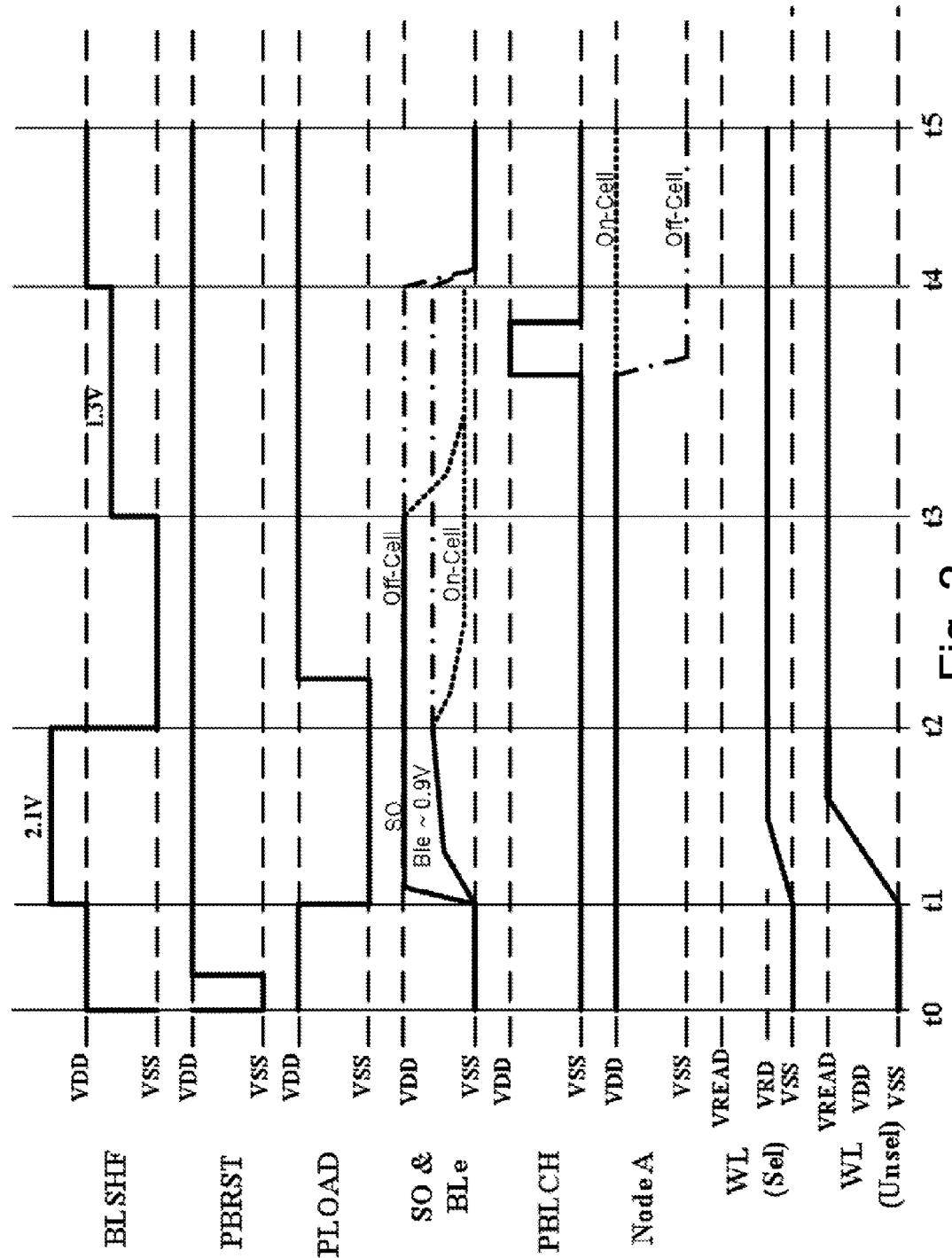
FIG. 2 shows some typical time lines of some key control signals for properly operating prior-art NAND array as seen in FIG. 1.

FIG. 2 shows the waveforms and time sequence for one Read operation:
a) t0-t1: The initial set up period
  BLSHF signal is set to Vdd=1.8V to connect SO to BLe but disconnect to BLo. PBRST signal switches from Vss to Vdd to set node A to Vdd and then shut off again.
  PLOAD signal is set to Vdd to shut off MP20 and set SO to Vss.
  SO=Vss, BLe=Vss (Initial voltage).
  PBLCH=Vss to prevent leakage through MN25 during Latch's preset period.
  Node A=Vdd after Latch preset period.
  WL(selected) at Vss.
  WLs(non-selected) at Vss.
b) t1-t2: BL precharge, WL-select set up and WL-non-select charge-up period
  BLSHF signal is set to Vdd=2.1V to precharge BLe=0.9V but BLo=VSS.
  PBRST remains at Vdd to keep node A=Vdd.
  PLOAD is set to Vss to supply the precharge current to BLe through MN23 with MN22=off state.
  SO=Vdd, BLe=0.9V (Initial voltage), BLo=0V.
  PBLCH=Vss to prevent leakage through MN25 during Latch's preset period.
  Node A remains at Vdd.
  WL(one selected) at $V_{RD}$ switched from 0V to $V_{RD}$.
  WLs(31 non-selected) at $V_{READ}$ switched from 0V to 6V.
c) t2-t3: BL discharged or remains precharged state, WL-select set up and WL-non-select charge-up period
  BLSHF signal is set to Vss to shut off MN23 for faster BLe discharge due to no precharge current flow again if cell's Vt<$V_{RD}$. If cell's Vt>$V_{RD}$, then BLe stays at precharge value of 0.9V.
  PBRST remains at Vdd to keep node A at Vdd.
  PLOAD is set to Vdd to stop the precharge current to BLe through MN23 with MN22 at off state.
  SO=Vdd and BLe=0.8V if NAND Vt>$V_{RD}$ but SO=BLe=Vss if NAND Vt<$V_{RD}$ PBLCH remains at Vss to prevent leakage through MN25 during Latch's preset period.
  Node A remains at Vdd.
  WL(selected) keeps $V_{RD}$=0V for SLC.
  WLs(non-selected) keep pass voltage $V_{READ}$=6V.
d) t3-t4: NAND cell Vt sensing and determination period
  BLSHF signal is set to 1.3V to reconnect SO to BLe, preparing for sensing NAND cell in BLe.
  PBRST remains at Vdd to keep node A at Vdd.
  PLOAD is set to Vdd to stop the precharge current to BLe through MN23 with MN22 at off state.
  SO=Vdd and BLe=0.8V if NAND Vt>$V_{RD}$ but SO=BLe=Vss if NAND Vt<$V_{RD}$ PBLCH is one-shot pulse to latch the precise data through MN25 during Latch's preset period.
  Node A remains at Vdd.
  WL(selected) keeps $V_{RD}$=0V for SLC.
  WLs(non-selected) keep pass voltage $V_{READ}$=6V.
e) t4-t5: The end of ½-page Read operation:
  All signals are reset with a set of biased conditions like at t0-t1, preparing for BLo sensing for next Read cycle.

FIG. 3A shows a cross-sectional cell configuration of one 2-poly, NMOS, HiNAND cell under Program-Inhibit bias condition according to an embodiment of the present invention, which is being formed inside the TPW, within the DNW on top of P-substrate. In a specific embodiment, this HiNAND cell is preferably using a non-Self-Boosting Program-Inhibit scheme to prevent the FN-channel tunneling Program. Self-Boosting (SB) technique is commonly used in typical NAND design.

The HiNAND cell's preferred non-SB Program-Inhibit $V_{Inhibit}$ voltage bias conditions are summarized below. With the following bias condition to the selected NAND cell in the selected WL or page of the selected Block, no Program operation happens. Thereby, the NAND cell's Vt stay at the initial Erased state, Vte, e.g., Vte<−0.7V. As we know that in the conventional NAND Program operation, this $V_{Inhibit}$ voltage is not supplied directly from each corresponding data bit of the PB through each corresponding GBL metal line. Instead, it is generated by SB (Self-Boosting scheme) from ramping a Vpgm voltage of one selected WL to the channels of selected NAND cells. The selected cell's channel voltage starts from the initial precharged floating voltage of Vdd-Vt. The Vdd voltage is supplied from each bit of PB through each corresponding GBL. But the coupling effect is strongly affected by the stored Vts of cells in adjacent BLs and WLs. Thus the $V_{Inhibit}$ voltage is also affected by the background data patterns of adjacent cells and is getting unreliable when NAND technology migrates to below 2×nm. Therefore, the most reliable way to have $V_{Inhibit}$ voltage in the channels of unselected programmed cells in the selected page is to directly couple with a strong $V_{Inhibit}$ HV power source generated from a dedicated $V_{Inhibit}$ charge-pump (driver) circuit. But this $V_{Inhibit}$ voltage is preferably not being supplied from PB through all long GBL metal lines. In today's NAND technology, each GBL capacitance may have a value ranging 3-5 pf. For an 18 KB GBL, the total GBL capacitance would reach up to 128 nF, which will consume too high current when all the GBL capacitance is charged to $V_{Inhibit}$ voltage in worst case.

In some alternative approaches, a $V_{Inhibit}$ voltage of 7V is supplied from a selected source line into the Flash channels on the selected WL of the selected NAND Blocks so that the power consumption can be reduced during $V_{Inhibit}$ precharge operation. But the current flow of the supplying $V_{Inhibit}$ voltage is through the NAND String bottom that contains many programmed cells with higher Vt values. That would make the $V_{Inhibit}$ charges to flow from NAND String bottom up to the selected NAND cells' channels more difficult unless the Vpass voltage is increased more but that would induce more Vpass WL disturbance. Additionally, $V_{Inhibit}$ charge flow will suffer more resistance to pass through these programmed NAND cells in series from below WL of the selected program cells. This current flow of $V_{Inhibit}$ HV from NAND String bottom is also against the current flow of the LV Vdd and Vss from NAND String top.

In a specific embodiment, this HiNAND BL-hierarchical structure is configured to supply $V_{Inhibit}$ HV from a 7V power line through the selected bus BBLps by a $V_{Inhibit}$ charge-pump (driver) circuit. Each BBLps is preferably driven by each corresponding driver circuit. Therefore, only one BBLps laid out in a horizontal (X-direction) line perpendicular to the GBL metal line is selected to precharge the selected BBL line with a capacitance much smaller than the capacitance of 18 KB long and heavy GBL line. Thus, lots of power consumption can be saved for this HiNAND Program-Inhibit scheme.

Since a low-power direct $V_{Inhibit}$ precharge can be achieved in the present HiNAND design so that the unreliable SB method is replaced by a preferred non-SB Program-Inhibit (PI) scheme. Note, all conventional PI schemes including SB, LSB and EASB use self-boosting technique, thus are affected by background NAND flash patterns and all are unreliable in the same sense.

In an embodiment, the direct $V_{Inhibit}$ precharge method implemented for the present HiNAND array is to precharge all BBL lines in the selected Segment. Thus the $V_{Inhibit}$ voltage would be coupled to GBL metal3 lines through SBL metal2 lines. Those GBL metal lines as well as SBL metal lines being preset to Vss will discharge the corresponding BBL lines to Vss but those GBL lines and SBL lines being preset to Vdd-Vt will retain those corresponding BBL lines at $V_{Inhibit}$ voltage without being discharged. As a result, both program BBL voltage (Vss) and program-inhibit BBL $V_{Inhibit}$ voltages will be selectively retained as charges in a plurality of Block BBL capacitors BBLcaps. Each BBLcap has a value ranging from 0.1 pf to 0.5 pf. Thus these local BBLcaps become the local voltage tanks of Vss and $V_{Inhibit}$ with enough charges. The direct Vss and Vdd-Vt voltages supplied from PB through GBL and SBL lines become unnecessary during the Program period of 200 μS per SLC Program operation. Therefore, the local BBL selected transistors are then shut off to release the SBL and GBL lines for next page data to be supplied for the next selected page in the different Blocks in the different or same Segments of different or same Groups of the HiNAND array. The Multiple-WL Program set up to trap the desired Vss and $V_{Inhibit}$ voltages in accordance with the page data will be repeated and stopped once all the desired N page data being fully loaded into the selected N BBL capacitors.

The following biased conditions are the preferred Program and Program-Inhibit bias conditions of a HiNAND cell. Actually, each HiNAND cell is the same as a NAND cell. Thus, the single cell Program, Erase, and Read conditions can be kept the same as the conventional NAND. Both the source node and the drain node of the selected HiNAND cell will be set to a MV=$V_{Inhibit}$≥7V as a program-inhibit voltage $V_{Inhibit}$.

1) Program-Inhibit bias conditions for 2-poly HiNAND or NAND cell (see FIG. 3A):
  a) Gate Vg=Vpgm=15V-25V
  b) Drain and Source Vd=Vs=MV=$V_{Inhibit}$≥7V
  c) TPW $V_{TPW}$=0V
  d) DNW $V_{DNW}$=Vdd
  e) P-substrate Vp-sub=0V After Program operation, these PI-cells would be prevented from being programmed, thus the cell Vts would stay at the erased-state, Vte, where Vte≤−0.7V, typically.

2) Program bias conditions for 2-poly HINAND or NAND cell (see FIG. 3B):
  a) Gate Vg=Vpgm=15V-25V
  b) Drain and Source Vd=Vs=0V
  c) TPW $V_{TPW}$=0V
  d) DNW $V_{DNW}$=Vdd
  e) P-substrate Vp-sub=0V After Program operation, the HiNAND cell's Vt is increased from erased-state value of a negative Vte to the programmed state values of positive Vts. For example, 3 MLC states A, B, C for one MLC cell, 7 positive states for one TLC cell, and 15 positive states for one XLC cell.

In a specific implementation, FIG. 3C shows the regular 8 Vt-distributions of one TLC HiNAND cell with 8 binary state assignments of 111, 110, 101, 100, 011, 010, 001 and 000 for eight respective states of E, A, B, C, D, E, G with the reference voltages of R1-R7 and VFY1-VFY7 between each adjacent MLC states for a MLC Read operations. Many other 8 TLC state assignments can also be accepted for this HiNAND cell and array.

FIG. 3D shows a preferred HiNAND3 array with 3-level BL-hierarchical structure of the present invention. In each level of the BL-hierarchical structure there is one dedicated metal line, running in Y-direction with a different BL capacitance due to different length. In this HiNAND array, the length of a top BL line is preferably laid out to be longer than the length of each corresponding lower-level BL line, giving a relatively larger BL capacitance for the top BL line.

In a specific embodiment, the flash cell architecture of the HiNAND3 array preferably comprises J HiNAND Groups such as Group 1 to Group J laid in the Y-direction as shown in FIG. 3D. Additionally, each HiNAND Group preferably comprises L HiNAND Segments such as Segment 1 to Segment L also laid in the Y-direction. Furthermore, each HiNAND Segment preferably comprises K NAND Blocks such as Block 1 to Block K still laid in the Y-direction. Moreover, each HiNAND Block comprises N NAND Strings aligned in X-direction (perpendicular to the Y-direction). Each NAND String in a Block (e.g., selected Block 1 within Segment 1) comprises M NAND cells, denoted as MCs, connected in series with one top String-drain Select NMOS transistor, denoted as MG, gated by GSL[1], and with another bottom String-source Select NMOS transistor, denoted as MS, gated by SSL[1] signal. The desired value of M can be 8, 16, 32, 64, 128 or any arbitrary integer number, without using dummy NAND cells. The determination of the value of m is fully depending on the specs and applications. For example, in a 2×nm NAND node, M=64 is very popularly used because it is for an optimized NAND String length size and performance.

Each Group comprises N global BLs (GBLs) such as GBL[1] to GBL[N] using the long and heavy top metal3 lines laid in parallel in the Y-direction and perpendicular to WLs or pages. These GBL metal3 lines are connected directly to N outputs of a top circuit block comprising of Page Buffer (PB), Multiplier and Sense Amplifier (SA). Each of the N GBL metal3 lines is further divided into J SBL (Segment BL) metal2 lines connected in parallel to each GBL. The N SBL lines in one Segment, for example, SBL_1[1] to SBL_L[N] in Segment 1, are arranged in X-direction. Each SBL_L[N] line is still laid out in the Y-direction in parallel to each GBL[N] metal3 line but having a preferred much shorter length. Each SBL metal2 line is laid out across all L Segments from Segment1 to Segment L within each HiNAND Group. Thus, a length of SBL, $L_{SBL}$, is ranging from 1/20 to 1/10 of the length of GBL, $L_{GBL}$.

The length ratio $C_{SBL}/C_{GBL}$ being in an range from 1/20 to 1/10 is selected for achieving a fast All-BL Read operation in unit of one full physical page of this HiNAND array by using a DRAM-like BL charge-sharing technique. It is know that the BL charge-sharing between DRAM cell's capacitance and DRAM BL capacitance is done by making a similar ratio $C_{cell}/C_{BL}$ in a range from 1/20 to 1/10. The detailed operation of the preferred DRAM-like charge-sharing technique is shown below to apply to the All-BL Read operation associated with the HiNAND of the present invention.

In this HiNAND array (see FIG. 3D), the All-BL Read operation is just an All-GBL Read operation. For conventional NAND, there are options of all-BL Read and Odd/Even Read. Firstly, an All-BL Read operation can be executed like a 1-cycle Read from one full physical WL or page of NAND array, though other approaches of All-BL sensing technique without a precharged state can be used as well for one full physical WL or page Read. The WLs and BLs bias conditions of the selected String in the selected Block are listed below:
  a) Read voltage for a select WL=Vrm, m=1 for SLC Read but m=1, 2, 3 for MLC Read.
  b) Vr1=0V for SLC Read to distinguish E state and A state.
  c) Vr1=0V, Vr2=1V, and Vr3=2.5V for MLC Read, where Vr2 is used distinguish A state and B state and Vr3 is used distinguish B state and C state.
  d) $V_{GBL}$ of about 0.7V to 1.0V is precharged to all GBL lines initially prior to reading.
  e) $V_{GBL}$ is about 0.7V to 1.0V, if the selected NAND cell's Vt is above Vrm, thus no conduction of cell current.
  f) $V_{GBL}$ is 0V, if the selected NAND cell's Vt is below Vrm, thus a conduction of cell current.

Secondly, in a conventional NAND an Odd/Even Read operation can be executed like a 2-cycle Read from one full physical WL or page of NAND array, though other approach of All-BL sensing technique without a precharged state can be used as well for one full physical WL or page Read. The whole physical WL is divided into 2 halves. One half BLs belong to the Odd-BL group denoted as BLo lines and the other half BLs belong to the Even-BL group denoted as BLe lines as seen in FIG. 1. The WLs and BLs bias conditions of the selected String in the selected Block are listed below. The Read voltage, Vrm (m=1, 2, 3 . . . depending on types of storage like SLC, MLC . . . ), of one selected WL is kept the same as the one for above All-BL Read operation.
  a) Read voltage for a select WL is Vrm, m=1 for SLC Read but m=1, 2, 3 for MLC Read.
  b) Vr1=0V for SLC Read to distinguish E state and A state.
  c) Vr1=0V, Vr2=1V, and Vr3=2.5V for MLC Read, where Vr2 is used distinguish A state and B state and Vr3 is used distinguish B state and C state.
  d) $V_{GBLo}$ is set to 0.7V-1.0V or 0V when GBLe lines are selected for ½-WL Read.
  e) $V_{GBLe}$ is set to 0.7V-1.0V or 0V when GBLo lines are selected for ½-WL Read.
  f) $V_{GBLo}$ is 0V, if the selected NAND cell's Vt in GBLo is below Vrm, thus a conduction of cell current.
  g) $V_{GBLo}$ is 0.7V-1.0V, if the selected NAND cell's Vt in GBLo is above Vrm, thus no conduction of cell current.
  h) $V_{GBLe}$ is 0V, if the selected NAND cell's Vt in GBLe is below Vrm, thus a conduction of cell current.
  i) $V_{GBLe}$ is 0.7V-1.0V, if the selected NAND cell's Vt in GBLe is above Vrm, thus no conduction of cell current.

Unlike the All-BL Read operation in conventional NAND, the All-GBL Read operation in the HiNAND array of the present invention utilizes a preferred DRAM-like charge-sharing technique with details being disclosed below. In particular, one major difference of the All-GBL Read versus conventional All-BL Read is that a pre-Read step for precharging All-GBL lines to Vdd-Vt is not needed. Instead, All-GBL lines of the HiNAND array (see FIG. 3D) are pre-discharged to Vss through one 7V NMOS device MGBLs (which is a similar device as MSe and MSo in FIG. 1 of the conventional NAND array). Since the 7V NMOS device has thinner gate oxide layer than the 20V device MN3 and MN4 in the conventional NAND, thus the discharging and charging of GBL line is speeded by 5-fold.

In other words, in this HiNAND All-BL Read operation, no GBL is precharged to Vdd-Vt. Thus power-consumption of GBL-precharge step is totally eliminated. A new set of WLs and BLs bias conditions of the HiNAND All-BL Read operation is listed below, referring to FIG. 3D:
  a) Read voltage for a select WL=Vrm, where m=1 for SLC Read but m=1, 2, 3 for MLC Read.
  b) Vr1=0V for SLC Read to distinguish E state and A state.
  c) Vr1=0V, Vr2=1V, and Vr3=2.5V for MLC Read, where Vr2 is used to distinguish A state and B state and Vr3 is used to distinguish B state and C state.
  d) $V_{GBL}$ is 0V for all GBL lines, regardless of data stored in PB. This is done by coupling G_PRE to Vdd and GBLps to Vss so that all GBLs are in a conduction state to pull down the voltage of all GBL[N] to Vss, where the number N varies from 1 to N.

Note, this HiNAND All-BL Read operation does not require the long heavy global bit line to be precharged. Therefore, high power consumption due to the big total capacitance of about 128 nF in all GBL metal3 lines is eliminated. Instead, the precharge is switched to divided shorter local bit lines with much smaller capacitances and a DRAM-like charge-sharing scheme along with the WL-voltage is used to provide a much reduced GBL charge.

In a specific embodiment, the All-GBL HiNAND Read operation is performed using a three-step process. In a first step of the All-GBL Read operation, precharge of local BBL and SBL is performed. In particular, the preferred precharge operation happens on the shorter SBL metal2 lines that have a length equal to only 1/20 or 1/10 of the length of the long GBL, assuming that the HiNAND array is divided into J≥10 Groups. Referring to FIG. 3D, these SBL lines include SBL_1[1] to SBL_1[N]. The precharged SBL voltage is Vdd=1.8V in a specific embodiment of the present invention. The following Table II summarizes the two types of NAND precharge operation ((assuming total number of Groups is J=10 for the HiNAND as an example, although typical choice of J is 8 or 16).

TABLE II

|  | HiNAND | NAND |
| --- | --- | --- |
| Precharged voltage | 1.8 V | 0.9 V |
| Precharged capacitance | SBLcap = 1/10 of GBLcap | GBLcap |

TABLE II-continued

|  | HiNAND | NAND |
| --- | --- | --- |
| Precharged power ratio With All-BL Read scheme | 0.2X | 1X |
| Precharged power ratio | 0.1X, All-GBL Read scheme | 1X, Odd/Even Read scheme |

As seen from above simple calculation in Table II, the HiNAND only consumes about ⅕ power of prior-art NAND in Read operation when both adopt the All-BL Read operation with precharge scheme. The HiNAND array (with 10 Groups) only consumes at least ¹⁄₁₀ power compared to a prior-art NAND array in Read operation when the HiNAND uses All-GBL Read scheme while the prior-art NAND uses Odd/Even Read scheme. For Odd/Even Read scheme, the whole N GBL lines have to be additionally precharged once to Vdd-Vt besides the regular N GBLs precharges determined by the stored Data pattern (i.e., 0 or 1) in PB. For example, ½N×GBLo is precharged to Vdd-Vt when reading ½N GBLe. Thus when reading ½N GBLe, total Charge1=½N×GBLo×0.9V+½N×GBLe×Data pattern. Similarly, when reading ½N GBLo, total Charge2=½N× GBLe×0.9V+½N×GBLo×Data pattern. Thus, total charge in a 2-cycle Odd/Even whole page Read is Charge1+ Charge2=N×GBL×0.9V+N×GBL×Data pattern. But total charge in a 1-cycle HiNAND All-BL Read is N×GBL×Data pattern. The "Data pattern" means 0.9V for "1" data but Vss for "0" data.

When All-GBL Reading is performed for Group 1, all N SBL metal lines and N BBL metal lines are precharged to 1.8V. The operation is performed from SBLps[1] metal0 line through N 7V NMOS devices MSBLs to precharge N SBL lines and from BBLps_1[1] through N 7V NMOS devices MBBLs to precharge N BBL lines with gates of N NMOS devices MGBLp coupled to Vss to prevent the leakage from SBL metal line to corresponding GBL metal line. The NMOS devices MGBLp and MSBLs (see FIG. 3D) are preferably made by same String-select 1-poly transistors as conventional NAND, such as MG or MS in FIG. 1. The gate voltage of device MSBLs is S_PRE[1] selected to be Vdd+ Vt to allow the full 1.8V passage from SBLps[1] (metal0 line) to each of SBL_1[1] through SBL_1[N]. The device MSBLs has to be formed within the same TPW and DNW with the HiNAND array. During HiNAND Erase operation when TPW=20V, the gate of the MSBLs device is floating to cancel the 20V stress from TPW below.

A second step of the all-GBL HiNAND Read operation is associated with a page data development period. After all N SBL lines are being fully precharged to 1.8V or even a little higher such as 2.0V, a desired set of various control voltages of GSL, SSL and all WLs in one page is applied with all MSBLp devices being set to an off-state to perform All-BL Read operation or Program-Verify operation to the selected WL of the selected NAND Block. For example, for a SLC Read, the selected WL is set to 0V, and 63 non-selected WLs (of a 64T String per Block) are set to Vread=6V, and GSL[1] and SSL[1] are set to 4-6V. Part of N SBL capacitor voltages will start to discharge from initial 1.8V to Vss if the corresponding NAND cells are at erased E-state with Vte≤− 0.7V within a predetermined discharge time. The remaining part of N SBL capacitor voltages will not discharge and retain the initial 1.8V if the corresponding NAND cells Vts>0, corresponding to an A-state.

Thus from the above explanation, after All-GBL Read operation of this HiNAND array, the BBL lines in the selected Segment and the SBL lines in the selected Group will trap respective Vss and 1.8V voltages in accordance with the stored NAND Data pattern on the selected WL of the selected Block in the selected Segment in the selected Group of this HiNAND array. After All-GBL Read, the local SBL_1[N] voltage is at 1.8V or Vss but all N GBL lines is at 0V. All N GBL lines are still isolated from all N SBL lines.

In a third step of the all-GBL HiNAND Read operation, charge-sharing is performed for Read and Program-Verify operations. The charges in N SBLs would be dumped to N GBLs. In other words, the charge-sharing will happen between N SBL lines and N GBL lines by turning on N 7V NMOS devices MGBLp when DST[1] is set to 1.8V+Vt. After this third step, the voltages of N GBL[N] are at ~0.18V or 0V due to charge-sharing and $C_{SBL} \sim \frac{1}{10} C_{GBL}$.

Accordingly, a $\Delta V_{GBL}$ is only 0.18V−0V=0.18V, after the completion of the 3-step process of All-GBL Read or Program-Verify operation. In another embodiment, one additional step of All-BL Read and Program-Verify operations is needed to amplify the small $\Delta V_{GBL}$=0.18V to a larger value so that it is a more reliable signal to be developed by a Latch SA of the present invention. In the HiNAND array architecture of the present invention, we propose to add a Multiplier that has an amplification factor being an integer no smaller than 2. In practice, the determination of the amplification factor is associated with the ratio between the capacitances of GBL, SBL, and BBL lines. The details of $\Delta V_{GBL}$ voltage amplification and development will be explained in sections below.

In addition, each GBL, SBL, or BBL line is associated with one NMOS device connected to a corresponding power line such as GBLps, SBLps, and BBLps, laid out in the X-direction (see FIG. 3D). These 1-poly NMOS devices include MGBLs, MSBLs, and MBBLs and one device per each line of GBL, SBL, and BBL. But a 2-poly NMOS device with a set programmed Vt can also be used. There are other groups of N preferred NMOS devices in Group 1 to connect between corresponding GBL[N], SBL_1[N], and BBL_1_1[N] lines in different BL-hierarchical levels. In order to save the cost, the preferred number of metal lines is limited to 3 or less. For example, these devices include 1) N 1-poly NMOS transistors MGBLp between the top metal3 lines GBL[1] through GBL[N] (for all Groups) in the Y-direction and one common power line of GBLps in X-direction; 2) N 1-poly NMOS transistors MSBLp connected between top metal3 lines GBL[1] through GBL[N] and middle metal2 lines SBL_1[1] through SBL_1[N] (also in the Y-direction, for all Segments in Group 1), and 3) the N 1-poly NMOS transistors MBBLs connected between middle metal2 lines SBL_1[1] through SBL_1[N] and bottom metal1 lines BBL_1_1[1] through BBL_1_1[N] (also in the Y-direction).

But the concept of a general m-level BL-hierarchical scheme for this preferred HiNAND array should not be limited to only 3-level BL-hierarchy. Note, the way of counting 3 BL-levels does not include the metal0 line that is reserved for all power lines such as GBLps, SBLps, and BBLps as well as one common NAND-String source lines of CSL[N], all being laid out in the X-direction.

In order to dramatically save the power-supply current to GBLps, SBLps, BBLps and CSL, it is preferable not to connect the plurality of lines of GBLps, SBLps, BBLps, and CSL together because n-fold capacitance will occur on above metal0 lines. Each line of GBLps, SBLps, BBLps, and CSL is preferably connected to a unique driver. Thus only the selected lines of GBLps, SBLps, BBLps, and CSL are supplied with Vdd or $V_{Inhibit}$ voltages. The unselected lines and associated capacitances would not be charged, thus the fast speed and low-power consumption of multi-WL Program and Read operations can be achieved in accordance with the HiNAND array of the present invention.

In a specific embodiment, the small $\Delta V_{GBL}$=0.18V is amplified to a much larger reliable $\Delta V$ signal by a DRAM-like SA as explained below using a preferred Multiplier. Practically, for a reliable and optimal $\Delta V_{GBL}$ sensing, the mis-matched $\Delta Vt$ and parasitic capacitance of two input-nodes Q and QB and MOS devices of the DRAM-like SA have to be well designed in the NAND circuit. Referring back to FIG. 1, in the conventional Odd/Even Read NAND scheme, all N GBLs are divided into two groups of N/2 Odd numbered BLos and N/2 Even numbered BLes. Each pair of BLo and BLe lines are directly connected to one corresponding Latch-type (INV1+INV2) SA through a GBL multiplexer made of a first pair of 20V 1-poly NMOS devices MN1 and MN2 and a second pair of another 20V 1-poly NMOS devices MN3 and MN4.

By contrast, in the All-BL HiNAND memory circuitry of the present invention, a preferred Multiplier circuit shown in FIG. 4 is inserted between each GBL line, e.g., GBL[N], and a Latch SA. The DRAM-like SA comprises several LV MOS transistors of MP3, MP2, MP4, MN2, MN4, MN3, MN7, and MN5 with several preferred control signals of RES, T3, T4, and T5. The conventional BL division of Odd-number BLo and Even-number BLe with one corresponding Multiplier is no longer required for this HiNAND design. As shown in FIG. 4, the detailed operations of the Multiplier plus a Connector and the Latch SA are explained below.

A) Multiplier operation: The Multiplier circuit is used to multiply the small detected $\Delta V_{GBL}$ by a multiplication factor that is developed at node GBL and passed to BLP node with an approximate value of 0.18V as explained in previous pages of this application. The $\Delta V_{GBL}$ is multiplied by the multiplication factor preferred to be equal to or greater than 2. As an example, the node GBL mentioned here is same as one GBL line (GBL[1] through GBL[N]) seen in FIG. 3D.

The input or detecting node of the Multiplier is BLP sensing node. One major advantage of this HiNAND design over prior-art NAND is that the BLP sensing node is connected to its corresponding GBL metal3 line through the 20V NMOS transistor MN6 as it is biased into a conduction state by coupling BIAS signal to Vdd. The BIAS voltage in the conventional NAND circuit is a MHV that is higher than Vdd such as 2.3V in order to achieve a faster precharge of GBL to 0.9V because transistor MN6's Vt is about 1.2V typically for this 20V NMOS device having thicker-gate oxide and longer channel length.

Conversely in the present HiNAND design, the voltage at GBL line, $V_{GBL}$, is no longer 0.9V or Vss. Instead, it is a much reduced value of 0.18V and Vss after charge-sharing between each 1.8V-SBL line and a corresponding 0V-GBL line. Therefore, to have a full $\Delta V_{GBL}$ (1.8V and 0V) from GBL node to BLP sensing node, the BIAS voltage of 1.8V is large enough without need to boost to HV of 2.3V. In the conventional NAND, the BIAS signal is not a constant MHV but varying from Vdd to 2.3V and back to Vdd during Program-Verify operation. Thus the control circuit of BIAS is a little more complicated. In the present HiNAND circuit, with $\Delta V_{GBL}$ and $V_{GBL}$ being ~0.18V and Vss, a Vdd constant voltage and Vss is used for the BIAS signal to turn on or turn off the transistor MN6. Thus the BIAS control circuit becomes greatly simplified in the HiNAND design.

The output port of the Multiplier is OUTP node which outputs an amplified voltage signal after N-cycle multiplication operation of the Multiplier's input voltage at BLP sensing node, where N is the multiplication factor chosen from any integer number larger than 1 depending on the required minimum $\Delta V_{GBL}$ value and speed and area tradeoff for the reliable sensing of the Latch SA that is connected to the OUTP node.

In the Multiplier with M capacitors for providing a programmable multiplication factor M+1 for amplifying the sensed input voltage, selecting a larger M for a larger amplified $\Delta V_{GBL}$ will result in a larger silicon area and more sensing cycles of sample and hold operation in each Multiplier circuit because more capacitors such as C[0] through C[M−1] are required (see FIG. 4). Practically, too many cycles (M>3) of sample and hold operation on Multiplier's M capacitors to accomplish the final desired $\Delta V_{GBL}$ is not preferable for this fast multiple-WL Program and Read operations. A preferred number of capacitors M is 2 or 3.

As shown in FIG. 4, every capacitor of C[0] through C[M−1] is connected to two NMOS LV pass transistors. All capacitors C[0] through C[M−1] are connected in series from the top OUTP node to a bottom node connected to IN[M]. The capacitance value of each capacitor C[0] through C[M−1] can be made the same or different. The type of capacitor is preferably made of poly1-poly2, metal3-metal2 or metal2-metal1 capacitors without a Vt drop for a full coupling effect for this Multiplier's operation.

For example, the top poly2-plate of the first capacitor, C[1], is connected to two LV NMOS pass transistors. One LV NMOS pass transistor is MN[1] with its left input node connected to a common input node BLP, its gate tied to T[1] signal and its right output node connected to node IN[1]. The other LV NMOS pass transistor is MNN[1] with its drain node connected to node IN[1] and its source node connected to Vss with its gate tied to TP[1] signal. The bottom poly1 plate of the first capacitor C[1] is connected to top poly2 plate of the second capacitor C[2] (not shown in FIG. 4). The top common sensing node BLP is connected to a pull-up 20V NMOS transistor of MN6 with its gate tied to BIAS signal and its drain node is connected to each corresponding GBL, for example, GBL[N] in the HiNAND array.

Similarly, the bottom poly2 plate of the last capacitor, C[M−1], is connected to another two similar LV NMOS transistors. One transistor is MN[M] with its left input node connected to a common input node BLP, its gate tied to T[M] signal and its right output node connected to node IN[M]. The other LV NMOS transistor MNN[M] with its drain node connected to node IN[M], its source node connected to Vss with its gate tied to TP[M] signal.

The top plate of the capacitor, C[0], is connected to another LV NMOS pass transistor MN[0] with its left input node connected to a common input node BLP, its gate tied to T[0] signal and its right output node connected to OUTP node of the Multiplier. This OUTP node is also preferably coupled to a Connector circuit comprising two LV PMOS devices MP1 and MP5 connected in series. The gate of MP5 is tied to OUTP node. The top drain node of MP1 connected to a VDDP signal and the bottom source node of MP5 connected to a QB node, which is one input node of the Latch SA.

B) Connector circuit operation: There are many options for a preferred Connector circuit of the present invention. The major function of the Connector is to isolate the heavy capacitor loading on the OUTP node from one of SA's QB input node so that the capacitances on both QB and Q can be more easily balanced in layout with an additional advantage of voltage shifting or conversion into an optimal input voltage level for SA operation. With a clamped VDDP supply, when VOUTP is the amplified sensed GBL high voltage, it is optimized to turn off MP5 to keep VQB=Vss. Conversely, when VOUTP is the amplified sensed GBL low voltage, it will turn on MP5 to keep VQB=VDDP. The major function of the Connector is to connect the multiplied voltage output from the OUTP node to one input of the Latch SA at QB node. As shown in FIG. 4, in a specific embodiment, one of the preferred Connector circuit includes MP1 and MP5 between Multiplier's output and Latch SA's input. Of course, for those skilled in IC design, many other revisions of the Connector circuit can be designed but should be covered by this disclosure in principle.

In an embodiment, a first function of the Connector circuit (as seen in FIG. 4) is to reversely convert and amplify the input voltage of $\Delta V_{GBL}$ at OUTP node and couple to QB node, varying between a low value of the reset voltage at 0V when MP5 is in a shut-off floating high Z state when OUTP voltage is at 0.18V×N and a high value of the VDDP signal when both MP1 and MP5 are biased into on-states when T3B signal is set to Vss and OUTP voltage is at Vss. The voltage-gain of the Connector equals to $(VDDP-V_{QB})/\Delta OUTP$, where $\Delta OUTP=\Delta V_{GBL}$ and the initial reset voltage $V_{QB}$ at QB node is 0V.

In another embodiment, a second function of the Connector circuit is to isolate the sensing QB node from the highly capacitive node at OUTP so that one paired inputs of QB and Q nodes of the Latch SA can be easily designed to be fully symmetrical or tracking in terms of optimal layout, parasitic junction capacitance and reliable $\Delta V$ development between the QB and Q nodes of each Latch SA. The reset of QB node can be accomplished by shutting off MP3 and turning on MN7 with biased one-shot conditions of setting RES and T4 signals to Vdd in the beginning of SA operation. The T3B signal is to control on or off state of MP5. The VDDP voltage is set to be OUTP voltage plus MP5's Vt level. If OUTP voltage is 0.36V with 2-fold amplification and MP5's Vt is 0.7V, then VDDP voltage is about 1.06V (or less).

The Latch SA circuit is made of eight LV MOS transistors including three LV PMOS devices MP3 and MP2 and MP4, and five LV NMOS devices MN3, MN7, MN2, MN4, and MN5. The source node of NMOS device MN5 is connected to a $V_{REF}$ signal and its gate is tied to T3 signal and its drain node is connected to Q node (another input) of the Latch SA. The drain node of the left MN7 NMOS device is connected to the QB node and its gate is connected to a RES signal and its source node is connected to Vss. The top PMOS MP3's gate is connected to T4 signal and the gate of bottom NMOS MN3 is connected to T5 signal. The output nodes of the Latch SA are either Q or QB with a preferred tracking and equal junction capacitance for a reliable amplification of small $\Delta V$ of sensing signal present at Q and QB nodes initially.

For executing Multiple-WL and All-BL Read and Program-Verify operations, an on-chip PB is required like the conventional NAND circuit. Basically, the Multiple-WL and All-BL Read and Program-Verify operations of the present invention are more powerful and more flexible to allow both Read and Program-Verify performed simultaneously on more than one selected WLs from more than one selected Segments from more than one Groups of the HiNAND array. But only one N-bit PB connected to N GBLs is needed. The single PB with N GBLs is designed to be shared by all selected WLs in the HiNAND array. Thus, the multiple page data read out from multiple-selected WLs in multiple different Segments and Groups cannot be presented into this shared PB with N GBLs simultaneously because the page data contention would happen on N GBLs. This page data contention will result in fault reading and is not acceptable in NAND Read operation. But in the preferred multiple-WL and All-BL Read and Program-Verify operations of this present invention, this problem is properly solved as explained below.

Since Read and Program-Verify operations are merely different in Read voltage in the selected WL of the selected Block, the steps of operating Read and Program-Verify are basic the same. Thus, the following illustration is only focused on All-BL Read operation, though it should be the same for Program-Verify operation for those skilled in the art. In today's NAND design specification, it shows it takes about 20 µS for a SLC Read, 60 µS for a MLC Read, and about 150 µS for a TLC Read. The main improvement of the present All-BL Read operation within the HiNAND architecture over an Odd/Even Read operation in the conventional NAND are associated with efforts for a) Long GBLs precharged time reduction, b) WL set up time reduction, and c) BBL/SBL discharge time reduction.

In the conventional NAND single-WL Odd/Even Read operation, each GBL is precharged to 0.9V first, regardless of BLe and BLo. The whole GBLs in whole NAND array are precharged. This takes a long RC time with high power consumption. The RC time, $R_{precharge}C_{GBL}$, is fully determined by each GBL capacitance $C_{GBL}$ and effective resistance $R_{precharge}$ of each 20V NMOS device of MN3 connected to BLe or MN4 connected to BLo (see FIG. 1). Each GBL line capacitance value is about 3-5 pf but $R_{precharge}$ ha is determined by the bias and layout device conditions of MN3 and MN4. Typically, both MN3 and MN4 are made of a long-channel and thicker oxide NMOS device to sustain a 19.5V punch-through across its Vds during a normal NAND Erase operation. This 19.5V punch-through voltage is generated when TPW of NAND array is coupled to a 20V high voltage for a bulk FN-tunneling effect in Erase operation. This 20V high voltage will be forwarded to GBL with 0.5V PN-junction drop through the NAND cell P/N junction source and drain nodes and reach to the drain nodes of MN3 and MN4. MN3 and MN4 have to block this 20V high voltage to the LV PB shown in FIG. 1. During GBL precharge, the precharge current has to flow through MN3 to BLe and MN4 to BLo. Thus the $R_{precharge}$ of MN3 and MN4 are pretty high near 1 M'Ω in final precharge step due to MN3 and MN4 gate voltages in Read operation cannot be set too high otherwise the GBL precharge voltage cannot be limited below 0.9V. The Vt values of MN3 and MN4 are about 1.4V and the gate voltages are set to be about 2.3V. Thus, the GBL precharge time takes about ⅓ of Read latency, resulting in $t_{precharge}$(NAND)~7 µS. Its delay cannot be saved in NAND single-WL Read operation. But in the present HiNAND Read operation, assuming that 16 SBL lines from 16 Groups are precharged at the same time, then the delay is drastically reduced, resulting in $t_{precharge}$(HiNAND)~7 µS/16=0.4375 µS.

There is another long delay in conventional NAND single-WL Read operation to charge all WLs with a long RC time, which is $R_{charge}C_{WL}$. The $R_{charge}$ is the resistance of one driver of 20V NMOS Segment transistor and $C_{WL}$ is the WL capacitance. Particularly, the Vread voltage of non-selected multiple WLs in one selected Block is ~6V from a HV pump circuit. Due to the nature of the narrow-width and long WL length without a metal-strapping on top of each WL, this Vread delay easily takes about 4µS, resulting in $t_{WLdelay}$(NAND)=4 µS. Similarly, in this HiNAND read operation, if 16 selected WLs are being precharged at the same time, then the WL-charge-up delay can be drastically reduced as calculated below, resulting in $t_{WLdelay}$(HiNAND)= 4 μS/16=0.25 μS.

Additionally, another long delay of the conventional NAND single-WL Read operation results from a long RC time $R_{discharge}C_{GBL}$ to discharge all GBLs' precharged voltage of 0.9V. Unlike $R_{precharge}$ is a device resistance of MN3 or MN4 device in $t_{precharge}$ calculation, the value of $R_{discharge}=R_{select}+63\times R_{read}$, assuming a selected 64T NAND String having one selected WL and 63 non-selected WLs. Each $R_{read}$ of multiple non-selected cells in the selected String is small because high Vgs–Vt value of the non-selected Cells with gate voltages at Vread=6.0V. Vgs–Vt(C-state)=Vread–Vt(C-state)=6.0V–4.5V=1.5V for the non-selected NAND cells in the selected multiple WLs. But the selected Cell's gate voltage is Vr. Vgs–Vt(Program-state)≤0.4V, thus the resistance of $R_{select}$ is much larger, e.g., $R_{select} > R_{read}$. The typical effective $R_{discharge}$ is ranged about 1 M′Ω to 10 M′Ω for a String only conducting current ranging from 1 μA to 100 nA. As a result, the $R_{discharge}C_{GBL}$ (NAND) is too long with $t_{discharge}$(NAND)=10 μS. If the HiNAND array effectively discharges 16 BBLs and 16 SBLs on the same time then $t_{discharge}$(HNAND)=10 μS/16=0.625 μS.

In conclusion, the definition of simultaneous Read of this preferred multiple-WL Read scheme means the simultaneous operations of GBL-precharge, GBL-discharge, and WL charge-up delay. These operations are followed by the non-data contention dump of page data from the selected page to one shared N-bit PB and N GBL lines. Multiple-WL page data is transferred to one PB one by one not at the same time. But the transferring time of page data to the PB is as short as 1 μS or less, thus the total effective SLC Read delay can be potentially reduced from conventional 20 μS to about 2 μS including the time of dumping page data to the PB. This is about 10-fold reduction in Read latency and most suitable for operating a very fast NAND memory system.

The operation procedure on how to reduce the delay times of GBL precharge, GBL discharge, and WL charge-up by simultaneous operations of multiple-WL and All-BL Read related delays is shown below. Starting from one selected WL from one selected Segment in one selected Group for All-BL Read operation, the multiple-WL and All-BL Read will be extended based on the single-WL and All-BL Read. Therefore, the whole bit data quality of the whole NAND chip can be easily built, recorded and handled by a controller chip for a superior NAND memory system.

Now, the operation of the preferred Multiplier (FIG. 4) will be explained along with the GBL, SBL, and BBL structure in a HiNAND array that comprises J Groups per GBL, each Group comprising L Segments and each Segment comprising K Blocks. The GBL is equivalent to GBL[N] (see FIG. 3D) in accordance with a preferred set of bias conditions shown in FIG. 5.

As shown, the multiple-WL All-BL Read operation includes setting major control signals for executing following steps/functions that include Pre-discharging GBL, Precharging SBL, Discharging SBL, Charge-sharing, Multiplying and Sensing, and GBL resetting. The Charge-sharing function preferably happens between each GBL metal3 line and each corresponding divided SBL metal2 line and each divided BBL metal1 line to yield a small $V_{GBL}$ signal. The Multiplying function means to use a Multiplier to amplify the small detected signal $\Delta V_{GBL}$ to a larger $\Delta V$ at OUTP node (of the Multiplier) which is reversely amplified further by a Connector circuit as a small yet sufficiently large ΔV signal which is further outputted to an input node QB of a Latch SA. The Sensing function (of the Latch SA) means a signal development of the small yet sufficiently large ΔV signal presented at two input nodes Q and QB of the Latch SA to a full amplified voltage of Vdd. Multiple control signals in association of the HiNAND3's multiple-WL and All-BL Read operation are listed below:

a) G_PRE: This is gate signal of 1-poly NMOS Group-select transistor MGBLs used to connect all N GBL metal3 lines in Y-direction to one metal0 bus GBLps in X-direction (perpendicular to the Y-direction) simultaneously. All N GBLs include GBL[1] through GBL[N].

b) GBLps: This is a metal0 power line supplied for N GBL metal3 lines. If GBLps is coupled to 0V, then it is used to discharge all N GBLs to 0V for resetting. If GBLps is applied with Vdd, then it is used as a power line to precharge all N GBLs to Vdd (or other desired GBL voltages). There is only one GBLps power line in parallel to all WLs in the X-direction per one Group of the HiNAND array.

c) DST: This gate signal is used to control N 1-poly NMOS Segment-select transistors MSBLp for connecting top N GBL metal3 lines with the middle N SBL metal2 lines.

d) B_PRE: This gate signal is used to control N 1-poly NMOS Block-select transistors MBBLs for connecting the middle N SBL metal2 lines with the bottom N BBL metal1 lines.

e) BBLps: This is the metal0 power lines supplied for N BBL metal1 lines. One BBLps line in parallel to the WLs in the X-direction can be shared by two neighboring Segments in one HiNAND Group.

f) CSL: This is a common horizontal (X-direction) metal0 source line of HiNAND-String (similar as the prior-art NAND). In an embodiment, one CSL metal0 line is shared by two adjacent HiNAND Blocks source nodes mirrored in the Y-direction. In another embodiment, CSL line associated with every Block in all Segments within a same Group can be connected together. If Vdd is required during single or multiple-WL Program, CSL lines are preferably not connected together to reduce the power-consumption. In other words, one option is to have a separate CSL line per one paired mirrored HiNAND Strings.

g) SEC: It is a common gate signal of N 1-poly Segment-select NMOS transistors MSBLp respectively connecting between each SBL metal2 line and each BBL metal1 line.

h) SSL: This is the gate signal of NAND String-select NMOS transistor MS. During Read, the selected SSL is set to ≤Vdd to reduce channel voltage in the String of NAND cells, while the unselected SSLs=Vss.

i) S_PRE: This is the common gate control of the NMOS 1-poly Segment-select transistor, MSBLs, for precharging or discharging the voltages on N SBL_1[N] metal2 lines of all Segments in each NAND Group during Read operation. For HiNAND Read operation, only one S_PRE line in X-direction is required per one NAND Group.

j) SBLps: This is a metal0 power line per NAND Group. If SBLps=0V, then it is used to discharge all N SBL lines to Vss. If SBLps is applied to a precharge voltage Vpch, then it is used to precharge all N SBL lines to Vpch for All-BL Read and Program-Verify. The Vpch ranging from Vdd to $V_{Inhibit}$=7V can be charged for All-BL Read and Program-Verify operations.

k) GSL: The is the common gate signal of NAND String-select transistor MG. This one horizontal line laid out in the X-direction per NAND String. During Read, the selected GSL is coupled to a high pass voltage Vpass2 about 8-10V to pass Vdd up to 7V to the selected cell's drain node, while unselected GSLs are at Vss=0V.

l) WL: This is applied to Vrm for selected WL while the un-selected WLs=Vread=6V, where m=1 only for a SLC Read, m=1, 2, 3 for a MLC Read, m=1, through 7 for a TLC Read, and m=1, through 15 values of Vrm for a XLC Read. All above Read operation is within a preferred All-BL Read scheme of HiNAND array.

m) BBL: This is the bottom-level metal1 BLs. It is also the shortest BLs with least capacitances. This BBL capacitance is used for storing and latching the $V_{Inhibit}$ voltage initially for N BBL_1_1[N] lines for direct Program operation without a commonly used self-boosting scheme in the conventional NAND.

n) SBL: This is the middle-level metal2 BLs and it is mainly used to store the Vdd precharge voltage for All-BL Read operation on all N SBL_1[N] lines.

o) GBL: This is the top-level global BL metal3 lines.

In a specific implementation, the sequences of the preferred All-BL Read operation will be illustrated with reference to FIG. 5 and the HiNAND circuit shown in FIG. 3D. The preferred whole All-BL and Multiple-WL Read operation of the HiNAND array is preferably divided into several steps as shown below.

1) Pre-discharge period for all N GBL/SBL/BBL lines:
   Initially, before any Read, all N GBLs, N SBLs, N BBLs are preferably to be pre-discharged to 0V by the following bias conditions in the selected Groups. Note, for this HiNAND Multiple-WL and All-BL Read, multiple Group selections are allowed.
   a) Setting GBLps, SBLps, and BBLps to Vss.
   b) Setting G_PRE, B_PRE_1, and S_PRE[1] to Vdd.
   c) MGBLp, MSBLp and MBBLp are all in conduction state.
   d) The PB has to be isolated from GBL[N] to avoid GBL leakage.

2) Precharge period:
   This operation is only done on the selected N SBL lines and N BBL lines, rather on N GBL lines. In this HiNAND array, Read and Program-Verify operations would not require any precharge on the long and heavy GBL capacitance. Instead, the precharge is preferably done on the shorter SBL lines and BBL lines. As explained previously for dividing the HiNAND array into J (e.g, J=10) Groups, the $C_{SBL} \sim 1/J \times C_{GBL}$. During the precharge period, all N GBL lines are isolated from all N SBL lines. But the N SBL lines' voltages would be equal to all N BBL lines. In other words, in All-BL single-WL Read operation, the middle-level SBL metal2 lines and the bottom-level corresponding BBL metal1 lines are precharged to Vpch voltage ranging from Vdd=1.8V to $V_{inhibit} \sim 7V$. The Vpch precharged voltage can come from either one of two power lines of SBLps and BBLps or both. Both transistors MSBLp and MBBLp are all in fully conduction state with respective gates S_PRE[1] and SEC_1[1] (for selected Group 1) being set to Vpass2 (~Vpch+Vt~10V) voltage while DST[1] signal is set to Vss=0V to shut off the precharge current from leaking to GBL through N MGBLp transistors. After this period, the following conditions are set.
   a) N GBLcap at 0V.
   b) SBLcap are charged simultaneously to Vpch voltage from Vdd to $V_{inhibit}$=7V for independently selected SBLs in the selected one or more Groups.
   c) SBLcap at Vss=0V for unselected SBLs in the selected one or more Groups.
   d) BBLcap are charged simultaneously to Vpch voltage from Vdd=1.8V to $V_{Inhibit}$=7V for selected BBLs in the independently selected Segments of the selected one or more Groups.
   e) BBLcap at Vss=0V for unselected BBLs in the selected Segments of the selected one or more Groups.
   g) SSL is set to a bias voltage no greater than Vdd to the gate of String-select transistor MS to limit the channel voltage of cells after precharge. GSL is set to 0V to close the path to the CSL at ground.

3) Selected BBL lines discharge period in accordance with the multiple pages' data stored in the multiple selected pages: Only one page of physical WL per Segment is selected and there can be multiple selected pages in different selected Segments. This operation is only done on the selected N SBLcap and N BBLcap, rather on N GBLcap lines. After the discharge period, the followings conditions are set.
   a) N GBLcap at 0V, not affected by this period.
   b) Part of N BBLcap are retained at Vpch (Vdd=1.8V to $V_{Inhibit}$=7V) for those selected Off-cells with Vt>Vrm, in the multiple selected WLs in the selected Segments of the selected Groups (m=1 for SLC, m=1, 2, 3 for MLC, . . . ).
   c) Remaining part of N BBLcap are discharged through String-select transistor turned on by setting GSL to Vpass2~10V to Vss=0V for selected On-cells with Vt<Vrm, in the different selected Segments of the selected Groups.
   d) Part of N SBLcap are retained at Vpch (Vdd=1.8V to $V_{Inhibit}$=7V) for selected Off-cells with Vt>Vrm, in the selected Segment of the selected Groups because no discharge happens to the corresponding part of N BBLcap by setting SEC signal to Vpass2~10V to turn on each bridge transistor MSBLp between each SBL and corresponding BBL.
   e) Remaining part of N SBLcap are discharged to Vss=0V for selected On-cells with Vt<Vrm, in the selected Segment of the selected Groups.
   f) N BBLcap and N SBLcap are at 0V for each unselected Segment within unselected Groups.

4) Charge-Sharing period (CS):
   This operation is only done between N SBLcap and N BBLcap and N GBLcap. After the discharge period, the followings conditions are set by fully turning on MGBLp with the selected DST signal. Since GBLcap is 10×SBLcap (assuming J=10 Groups), thus the Vpch of 1.8V or 7V initial precharged values in SBLs is approximately reduced to Vpch/J of about 0.18V or 0.7V as explained above. Thereby the detailed charge-sharing operation is skipped here for simplicity.
   Before executing CS between GBL and SBL+BBL, there is a concern of coupling effects between two adjacent SBLs and BBLs (Left and Right) which may lower the final voltages of both BBL and SBL, thus affecting the final diluted GBL voltage below 0.18V if the precharged voltage is 1.8V. If that is the case, one solution is to increase the initial precharged voltage Vpch from 1.8V to a higher voltage to compensate for the coupling noise effect. In case when the BL-BL coupling effect is getting worse as NAND technology migrates to more advanced nodes, the precharge voltage Vpch is preferably increased to 7V to provide more margins to mitigate the coupling effect.
  a) Voltages of part of N GBLcap, N SBLcap, or N BBLcap remain as the initial value of 0V if the selected cells with Vt<Vrm, in the different selected Segments of the selected Groups.
  b) Voltages of remaining part of N GBLcap, N SBLcap, or N BBLcap drop to Vpch/J (e.g, 0.18V or 0.7V) if the selected cells with Vt>Vrm, in the different selected Segments of the selected Groups.
  c) N BBLcap and N SBLcap are at 0V for each unselected Segment within unselected Groups.
  Note, all the final N GBL voltages in accordance with the stored page data would be coupled to each corresponding node of BLP through MN6 shown in FIG. 4. Unlike the prior-art NAND to pass Vdd-Vt, the present invention is to pass 0.18V only. As a result, the BIAS signal at Vdd is enough. Thus BIAS control circuit does not need a HV so that the BIAS circuit becomes simpler.
5) Multiplying period.
  Using a precharge voltage of Vpch=Vdd=1.8V as an example, the final GBL voltage $V_{GBL}$=0.18 V or 0V is still too small for the normal operation of Latch SA shown in FIG. 4 if the device mismatch factors of SA are taken into consideration as explained in previous sections of the present application. Thus, a Multiplier circuit is needed to amply the $V_{GBL}$ to a voltage by several folds. The detailed operations were explained in prior pages and are skipped here for simplicity.
  After this period, the output voltage of the Multiplier is $V_{OUTP}$=3×$V_{GBL}$ if a three-cycle Sample and Hold Multiplier is used. The REF voltage is preferably set to be half of 3×$V_{GBL}$ generated by a HV pump circuit with a resistor-divider, not shown. The whole HiNAND can have only one VREF circuit. Then the ΔV between QB and Q node of SA=½×3×$V_{GBL}$=1.5×$V_{GBL}$=1.5×1.8V=2.7V which is large enough to compensate the Vt or other device mismatch between MP4+MN4 and MP2+MN2.
6) Sensing period: This operation is something like the ΔV signal development by a Latch, which is comprised of 3 LV PMOS devices of MP3, MP2 and MP4 and 3 LV NMOS devices of MN2, MN4 and MN3 plus 2 NMOS reset transistors of MN7 and MN5. There are 5 steps of SA operations.
  a) Connector disconnect step:
    By setting T3B=Vdd and VDDP=$V_{OUTP}$+Vtp, thus MP1 would be in non-conduction high Z state, The Vtp is the Vt of PMOS transistor MP5. The VDDP voltage can be generated from a common voltage-mirror circuit like MP1+MP5. For those skilled in circuit design, many circuit options can be used to generate VDDP+Vtp. Thereby, the details are not described here without affecting the explanation of the operating principle of the Connect circuit with two PMOS devices MP1 and MP5 (see FIG. 4).
  b) QB and Q reset step:
    Once Connector in high Z state, the QB and Q can be rest without leaking any DC current from VDDP to Vss. Both QB and Q nodes are predischarged first through MN7 and MN5 by setting RES and T3 signals to Vdd in an one-shot pulse with T4 signal being set at Vdd and T5 signal being set at Vss.
  c) A period of latching two input voltages to QB and Q from $V_{OUTP}$ and $V_{REF}$ for Latch SA. This is done by setting T3B signal to Vss and T3 signal to Vdd and VREF=0.5 VDDP by the one-shot pulse.
  d) T5 pull-down development period:
    This operation is done by ramping up T5 signal from Vss to Vdd.
  e) T4 pull-up development period:
    This operation is done by ramping down T4 signal from Vdd to Vss.
  After above 5 steps, a fully development Vdd vs Vss voltage will be generated at QB and Q nodes of each Latch SA with the following results:
  f) If $V_{OUTP}$=3×$V_{GBL}$=0.54V, then QB=Vss and Q=Vdd
  g) If $V_{OUTP}$=0V, then QB=VDDP and QB=Vdd and Q=Vss
  One of above two data at QB and Q nodes can be sent out to the corresponding bits in PB to report the detected storage data for SLC, MLC, TLC and XLC storages. After the sensing period (which is executed very fast following the multiplying period), the N GBLs are reset by switching G_PRE to Vdd to turn on the GBL-select transistors MGBLs for cleaning up all GBLs by dumping the charges to ground (with GBLps line at the ground level 0V) to make next page's Read operation ready.

FIG. 6 shows the preferred table of Multiple-WL & All-BL Program operation in HiNAND array according to an embodiment of the present invention. It starts out from setting one latch of one selected Segment of at a time. The number of selected latches, M, can be flexibly selectively set to be more than one Segment in different Groups in the HiNAND array for M-fold reduction in Program time because M WLs would be selected for simultaneous Program.

Firstly, a check of the total selected latches being set correctly as desired for performing simultaneous Multiple-WL Program in all selected Segments and in the selected Groups. If all desired latches of the selected Groups are not set yet, then multiple Segments' latch setting would be continued. Once the setting procedure of all latches of all selected Segments are being successfully set, then the Multiple-WL & All-BL Program operation would be proceeded.

The major control signals are listed and explained below.
  a) G_PRE: This is gate signal of 1-poly NMOS Group-select transistor MGBLs used to connect all N GBL metal3 lines in Y-direction to one metal0 bus GBLps in X-direction (perpendicular to the Y-direction) simultaneously. All N GBLs include GBL[1] through GBL[N]. The G_PRE signal can be set to Vdd+Vt for fully passing Vdd from the power line of GBLps to all N GBLs or set to Vdd for discharging or resetting the N GBLs to 0V if the metal0 bus GBLps is grounded.
  b) GBLps: This is the metal0 power lines for N GBL metal3 lines. If GBLps is at 0V, then it is used to discharge all N GBL lines to Vss. If GBLps is coupled to Vpch voltage ranging from Vdd to 7V, then it is used to precharge all N GBL lines to Vpch voltage or other desired GBL voltages. There is only one horizontal GBLps power line in parallel to WLs per one Group of the HiNAND array.

c) DST: This gate signal is used to control N 1-poly NMOS Segment-select transistors MSBLp for connecting top N GBL metal3 lines with the middle N SBL metal2 lines.

d) B_PRE: This gate signal is used to control N 1-poly NMOS Block-select transistors MBBLs for connecting the middle N SBL metal2 lines with the bottom N BBL metal1 lines. In an embodiment, B_PRE is preferred to be at $V_{Inhibit}$+Vt (Vpass2~10V) to precharge the N BBLs up to $V_{Inhibit}$ voltage ~7V from the corresponding BBLps line.

e) BBLps: This is the metal0 power lines for N BBL metal2 lines. If BBLps is at 0V, then it is used to discharge all N BBL lines to Vss. If BBLps is coupled to Vpch, then it is used to precharge all N BBL lines to Vpch voltage for All-BL Read and Program-Verify operations. For example, if BBLps is set to $V_{Inhibit}$, then it is used to precharge all N BBL lines to a value of above 7V for All-BL Program operation. In an embodiment, there is only one BBLps line in parallel to WLs per one Segment of one Group in the HiNAND array. In an alternative embodiment, each BBLps line can be shared by two neighboring mirror Segments in one Group in the HiNAND array.

f) CSL: This is a common horizontal metal0 source line of a HiNAND String. One CSL metal0 line is shared by two adjacent HiNAND Strings mirrored in Y-direction. If CSL is used for grounding, every CSL lines for each Block in all Segments within one Group can be connected together. If Vdd is required during Single or multiple-WL Program, CSL lines are preferably not connected together to reduce the power-consumption. In other words, one option is to have a separate CSL line per paired mirrored HiNAND Strings.

g) SEC: It is a common gate signal of N MSBLp which is a divided 1-poly Segment NMOS transistor coupled between each SBL metal2 line and each BBL metal1 line. During Program and Program-Inhibit operations, in an embodiment, the preferred voltage of SEC is set to $V_{Inhibit}$+Vt (e.g., Vpass2) is required to allow the full passage of $V_{Inhibit}$ voltage precharged from the corresponding SBLps line through N SBL_1[N] lines to reach its corresponding N BBL_1_1[N] lines.

h) SSL: This is the gate signal of NAND String-select NMOS transistor MS.

i) S_PRE: This is the common gate control of the String-select NMOS 1-poly transistors, MSBLp, for precharging or discharging the voltages on N SBL_1[N] metal2 lines of each NAND Group. For the HiNAND Read operation, only one horizontal S_PRE line is required per one NAND Group.

j) SBLps: This is a metal0 power line per NAND Group. If SBLps is at 0V, then it is used to discharge all N SBL lines to Vss. If SBLps is coupled to Vpch (e.g. Vdd), then it is used to precharge all N SBL lines to Vdd for All-BL Read and Program-Verify operations. If SBLps is set to $V_{Inhibit}$, then it is used to precharge all N SBL lines to a value of above 7V for All-BL Program, Program-Verify, and Read operations.

k) GSL: This is the common gate signal of NAND String-select transistor of MG. This is one horizontal (X-direction) line per NAND String. During page Program, the selected GSL=$V_{Inhibit}$+Vdd (or Vpass2) to pass full $V_{Inhibit}$ to the selected programmed cells' channels, while unselected GSLs=Vss.

l) WL(selected pages): Each WL means one physical NAND page. During Program, the selected WL=Vpgm, while the un-selected (and erased) WLs=Vpass1~7V, unselected adjacent programmed WLs=Vpass2~10V, and other unselected programmed WLs=Vdd.

m) WL(unselected pages): During Program, the unselected WLs=Vss.

n) BBL: This is the bottom-level metal1 BLs. It is also the shortest BLs with least capacitance. This BBL capacitance is used for storing and latching the $V_{Inhibit}$ voltage initially for N BBL_1_1[N] lines initially for direct Program operation without a SB scheme as commonly used in the conventional NAND.

o) SBL: This is the middle-level metal2 BLs and it is mainly used to store the precharge voltage for All-BL Read and Program-Verify operations on all N SBL_1[N] lines.

p) GBL: This is the top-level metal3 BLs.

Now, the multiple and All-BL Program would be explained. The Multiple-WL and All-BL Program operation is divided into following steps in accordance with FIG. 6 and HiNAND array circuit of FIG. 3D:

1) Predischarge GBL/SBL/BBL:

In order to predischarge all N GBLs, N SBLs, and N BBLs, setting gate control signals G_PRE, B_PRE (selected), S_PRE to Vdd to turn on transistors MGBLs, MBBLs, MSBLs along with grounding GBLps, SBLps, BBLps lines to 0V. Thus all charges in metal3 GBLcap, metal2 SBLcap and metal1 BBLcap are being discharged to Vss through the corresponding power lines simultaneously to save time.

2) Precharge BBL:

By using the preferred non-SBPI method of the present invention, all BBL lines are precharged with a MV=$V_{Inhibit}$~7V. Note, when precharging BBLcap, all the corresponding SBLcap and GBLcap are blocked from BBLcap (or BBL lines) to reduce the total capacitance of each BBLcap. As a result, the least precharge current can be achieved. In order to make sure only the selected N BBL lines are set for precharging MV, the corresponding N Segment-select transistors MSBLp are being shut off by grounding SEC signal so that the N BBL lines are isolated from corresponding N SBL lines. Since N BBL lines are blocked from N SBL lines, thus they are also blocked from N GBLs.

a) To precharge N BBL lines, setting B_PRE signal to Vpass2~10V to pass MV=$V_{Inhibit}$~7V through MBBLs from BBLps line.

b) Setting SSL signal to Vpass2~10V is to precharge each HiNAND String from bottom WLs (WL[64]) to the source node of the corresponding selected cell MC through a Block-select transistor MS. The top cells above the selected cell in the String are all erased cells with a negative Vte≤−0.7V.

c) To reduce the Vds of the Block-select transistor MG of each HiNAND String, a common source line CSL is coupled to Vdd.

d) To prevent leakage from N BBLs to N SBLs, SEC signal is set to 0V and DST signal is set to 0V to further isolate the SBL with GBL.

e) After this step, all N BBLcap associated with the selected Block in the selected Segments of the selected Groups is charged to MV~7V supplied from the power line BBLps, but N SBLcap and N GBLcap remain at 0V.

f) Besides to precharge N BBLs to MV voltage and all selected WL voltages are also being set up to the desired first Vpass1 to save time delay. Thus, $V_{WL}$=Vpass1~10V, regardless of selected and unselected WLs before program starts.

Note, the BBL precharge is performed simultaneously in multiple selected Blocks respectively associated with different Segments in one or more Groups, which is a very time efficient operation step with an estimated precharge time in just 1-3 μs for the HiNAND array in the present invention.

Also note, the BBL precharge can also be performed through SBLps power line by opening each Segment-select transistor MSBLs (setting S_PRE to Vpass2) and opening each Segment-transistor MSBLp (setting SEC to Vpass2).

3) Latch MV in N BBLcap and turn-off MV Precharge period:
  a) B_PRE(selected Block) is switched from the Vpass2 to Vdd first to shut off the current flow from each BBL to the power line BBLps which is retained at MV. Then B_PRE is further reduced to 0V to turn off the Segment-select transistor MBBLs, while turning off BBLps from MV to 0V, to prevent any leakage from N BBL lines to BBLps power line.
  b) SSL(selected Block) is lowered from Vpass2 to Vdd=1.8V so that the trapped charges in the HiNAND String does not leak out. Further, SSL is retained at the Vdd while the MV=$V_{Inhibit}$ voltage is supplied for the String from the local BBLcap without using a HV pump circuit. In other words, MV~7V voltage is solidly coupled to those program-inhibited NAND cells directly without using the conventional unreliable SBPI methods such as SB, LSB, and EASB.
  c) After this step, all N BBLs of the selected Block in selected Segments are charged (or trapped) to MV~7V voltage and all leakage paths have been shut off to prevent leakage current.

4) Sample current data (Voltage conversion of PB's Vdd/Vss to MV/Vss):
  DST is switched to Vpass1>Vdd to first turn on each Group-select transistor MGBLp to allow PB's data signal (Vdd/Vss) to pass from N GBLs to N SBLs. Then, SEC signal is set to Vdd (after the SBLs becomes Vdd/Vss level) to allow full passage of MV=$V_{Inhibit}$~7V voltage at each BBLcap to drop to zero if the corresponding SBL is at Vss=0V level from the PB while to retain the $V_{Inhibit}$~7V in BBL if the corresponding SBL is at Vdd level from the PB. Now, all N BBLcaps in a selected Segment (precharged to MV up to $V_{Inhibit}$ voltage) are sampled to convert Vdd/Vss levels in accordance with a page data stored in N-bit PB to $V_{Inhibit}$/Vss levels.
  a) If PB's data bits are 0V, then the capacitances BBLcap, SBLcap, GBLcap of corresponding BBL, SBL, GBL lines respectively drops to 0V.
  b) If PB's bits are Vdd, then the corresponding capacitance BBLcap retains $V_{Inhibit}$ voltage but SBLcap and GBLcap are at Vdd.
  After this step, the channels of the selected HiNAND cells in the selected page would be either 0V or $V_{Inhibit}$ voltage level converted from Page Buffer data of 0V or Vdd level. It is ready for next page Program on the selected WL.

5) Hold current data:
  a) One-page (one-WL) data Sample and Hold:
    Once all one-page program data being latched with $V_{Inhibit}$ or Vss voltage in all Strings of the selected Block, then all the NMOS devices MSBLp associated with the whole page have to be shut off by switching SEC signal to Vss to isolate each BBLcap from each corresponding SBLcap to free the buses of SBLs and GBLs for other concurrent operations.
  b) Multiple-page (multiple-WL) Sample and Hold:
    This multiple-page data Sample and Hold is done on one-by-one basis because the PB is shared by all selected pages. Any selected single page can be independently and sequentially loaded with single page data from the PB via the shared buses of GBL and SBL lines. Once the Sample and Hold for the currently selected page is done, both SBL and GBL buses will be freed, then the PB will be loaded with next page data for performing next Sample and Hold for the next one page. Until all multiple pages of BBLcaps being loaded with the desired multiple page data in multiple isolated BBLcap arrays, then multiple-WL Program operation can be performed simultaneously.

6) Multiple-WL Program simultaneously:
  The Multiple-WL Program operation of the present invention can be started concurrently after the successful multiple-page Sample and Hold step and the multiple selected WLs' program voltages being increased from initial Vpass2~10V to a final Vpgm of ~20V by using an ISSP scheme with 0.2V increment per step. In a specific embodiment of the non-SBPI multiple-WL Program scheme, all selected WLs of multiple selected Blocks are located at relative same String location (e.g., WL[1]) in multiple selected Segments. Under this scenario, one single Vpgm voltage can be generated simply from one common row decoder. In an alternative specific embodiment of the multiple-WL Program scheme, Program operations on different WL locations in different Strings and Blocks in one or more different Groups can also be applied. Under this scenario, multiple different Vpgm voltages have to be respectively latched first in parasitic poly capacitors associated with the selected multiple WLs before the Multiple-WL Program operation is started.

FIG. 7 shows a preset set of WLs Program voltages by using a preferred non-Self-Boosting Program-Inhibit scheme for Multiple-WL and All-BL Read and Program-Verify operations in the HiNAND array according to an embodiment of the present invention. So far, in all prior-art NAND Self-Boosting-Program-Inhibit (SBPI) methods is used with the $V_{Inhibit}$=Vdd rather than $V_{Inhibit}$≥7V being coupled to those GBLs of the program-inhibited cells and Vss for the selected programmed cells. There are three major SBPI methods such as SB, LSB and EASB. All of them adopted the SB scheme. The performance becomes unreliable when NAND node is scaled below 3×nm due to the BL-BL and WL-WL proximity coupling effects. The final $V_{Inhibit}$≥7V in SBPI scheme is generated from initial Vdd-Vt by WL and cell channel coupling effect. The advantage of the SBPI scheme is the use of low-power of Vdd, rather than 7V is coupled to long and large GBL capacitance, thus the PB can be built by LV devices. But, the SBPI scheme is performed in Odd/Even BL 2-cycle page Program due to the concern of BL-BL coupling effect. Particularly, when one program-inhibited GBL is sandwiched by two adjacent NAND cells biased at 0V, the boosting voltage will be degraded due to more parasitic coupling capacitance from two adjacent GBLs.

Conversely, in the HiNAND of the present invention a non-Self-Boosting-Program-Inhibit method is proposed for performing a HiNAND program operation as shown in FIG. 7. The program-inhibit voltage $V_{Inhibit}$≥7V replaces Vdd used for the conventional NAND Program operation. $V_{Inhibit} \geq 7V$ is also coupled to those GBLs of the program-inhibited cells and Vss is applied for the selected programmed cells. But, these $V_{Inhibit}$ voltages $\geq 7V$ are not coupled from the long GBLs from the PB. Instead, they are coupled from local short BBL lines that are supplied from the corresponding selected BBLps power lines. After one-shot of pulse of precharging the selected N BBLs lines with the $V_{Inhibit}$ voltages, the $V_{Inhibit}$ voltage is then latched as a temporary $V_{Inhibit}$ HV supply. The details have been explained throughout the specification.

Since the $V_{Inhibit}$ and Vss voltages are also supplied from HiNAND String top through the multiple erased cells with Vte $\leq$ −0.7V. Thus the un-programmed top WLs (from WL[1] to WL[m−1], if WL[m] is the currently programmed WL) are preferably coupled to a Vpass2 voltage. The Vpass2 is preferably set to be a about than half of Vpgm of about 20V, for example Vpass2~10V, to avoid the WL-WL punch-through between one selected programmed WL, WL[m], and the adjacent one (programmed) WL[m+1]. Other not-yet-programmed WLs, WL[m−1] up to the top WL[1] will be set just at a lower voltage Vpass1 which is selected to be slightly higher than a middle level precharge voltage MV that is trapped in the local BBLcap.

The main concept of this preferred non-SBPI scheme is to set WL voltages to ensure that the programmed WLs are coupled to the Vpass2 voltage only one time and Vpass1 WL stress only happens more than one time to those erased cells in the un-programmed unselected WLs, because the erased E state Vte is less sensitive to Vpass1 stress than A, B and C programmed MLC state or other 7 programmed states of TLC storage. As a result, the method shown in FIG. 7 has achieved almost negligible Vpass1 WL stress to those HiNAND cells storing the programmed Vts, regardless of SLC, MLC, TLC and even XLC storage types.

The Vpass1 voltage can be 2-3 Volts below Vpass2 of 10V. Because Vpass1 is the gate voltage to fully pass 7V $V_{Inhibit}$ voltage through the channels of erased cells which has a negative Vte, Vpass1=7V is enough. But Vpass2 is the gate voltage designed to fully pass 7V $V_{Inhibit}$ voltage to the program-inhibited cells in the selected WL[m] through the programmed cells. Thus Vpass2 voltage is preferably set to be 10V to get full $V_{Inhibit}$ passage without any drop for a reliable non-SBPI of the present invention.

Note, the top NAND String-select transistor has Vds=0V (both drain and source nodes are at $V_{Inhibit}$ Voltage) during this preferred non-SBPI method, thus the Gate-induced drain leakage (GIDL) effect is completely eliminated. Thus a dummy WL transistor between the top cell associated with WL[1] and the top String-select transistor is not needed. Similarly, the bottom String-select transistors Vds is smaller than 7V, thus GIDL effect is also dramatically reduced and bottom dummy is not needed. Thus, this non-SBPI design is more reliable for SLC, MLC. TLC and XLC programming in 1-cycle All-BL Program operation.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of performing multiple-WL & All-BL Read, Erase-Verify, and Program-Verify operations in a HiNAND memory array with BL-hierarchical structure, the method comprising,
    providing a HiNAND memory circuit, the HiNAND memory circuit comprising,
        a matrix of NAND memory cells divided to J Groups in column-direction having N global bit lines (GBLs), each Group being divided to L Segments in the column-direction, each Segment being further divided to K Blocks in the column-direction, each Block comprising N Strings in the column-direction or m Pages in row-direction, each String comprising m NAND memory cells connected in series sandwiched by a first String-select transistor and a second String-select transistor, each NAND memory cell in a Page being associated with a word line (WL), J, L, K, m, and N being integer numbers, wherein J is at least greater than 10;
        a BL-hierarchical structure comprising N metal3 lines corresponding to N metal2 lines and further to N metal1 lines all being parallel to each other in different topological levels along the column-direction, each metal3 line being used as one the N GBLs across all J Groups of NAND memory cells, each metal2 line being used as one of N sub-BL lines (SBLs) associated with each column of NAND memory cells across all Segments in each Group, each metal1 line being used as one of N sub-sub-BL lines (BBLs) across all K Blocks in each Segment;
        a plurality of metal0 lines laid out along the row-direction, the plurality of metal0 lines including at least one common source line connected respectively via the first String-select transistor to each of the N Strings of NAND memory cells in one or more Blocks of one or more Segments of each Group, a first power/Vss line for all J Groups, a second power/Vss line for all L Segments in a Group, and a third power/Vss line for all K Blocks in a pair of Segments in one Group;
        N first GBL-select transistors commonly controlled by a first gate signal to respectively couple the N GBLs with the first power/Vss line;
        N second GBL-select transistors commonly controlled by a second gate signal to respectively couple the N GBLs with the corresponding N SBLs;
        N first SBL-select transistors commonly controlled by a third gate signal to respectively couple the N SBLs with the second power/Vss line;
        N second SBL-select transistors commonly controlled by a fourth gate signal to respectively couple the N SBLs with the corresponding N BBLs;
        N BBL-select transistors commonly controlled by a fifth gate signal to respectively couple the N BBLs with the third power/Vss line; and
        a Page Buffer circuit respectively coupled to the N GBLs with latches to store and provide multiple page data in the form of sequential pipe-line;
    pre-discharging N GBLs, N SBLs and N BBLs to Vss=0V;
    precharging the N BBLs and the N SBLs in one or more selected Groups to a pre-charge voltage ranging from Vdd to 7V;
    discharging part of the N BBLs and the N SBLs to 0V in accordance with a page data stored in a selected page of NAND memory cells;

sharing the pre-charge voltage in the remaining part of the N BBLs and the N SBLs with the corresponding GBLs to generate a reduced GBL voltage;

multiplying the reduced GBL voltage to be sensed and amplified by a latch sense amplifier to latch the corresponding page data to the Page Buffer circuit for storing as digital bits.

2. The method of claim 1 wherein pre-discharging N GBLs comprises setting the first gate signal to Vdd to turn on the N first GBL-select transistors to connect with the first power/Vss line in ground level 0V, pre-discharging N SBLs comprises setting the third gate signal to Vdd to turn on the N first SBL-select transistors to connect with the second power/Vss line in ground level 0V, and pre-discharging N BBLs comprises setting the fifth gate signal to Vdd to turn on the N BBL-select transistors to connect with the third power/Vss line in ground level 0V.

3. The method of claim 1 wherein pre-charging the N BBLs and the N SBLs comprises supplying the pre-charge voltage up to 7V to the corresponding second power/Vss line, setting the third gate signal from 0V up to 10V, setting the fourth gate signal up to 10V to turn on the N first SBL-select transistors to connect the N SBL to the N BBL, and setting the fifth gate signal from Vdd to 0V, both the N SBLs and the N BBLs being isolated from the N GBLs by setting the second gate signal to 0V.

4. The method of claim 1 wherein pre-charging the N BBLs and the N SBLs comprises storing charges up to 7V to parasitic capacitances associated with the metal1 lines used for the BBLs at a low topological level connected with the metal2 lines used for the SBLs at a middle topological level in the BL-hierarchical structure within one selected Segment that is multiple fold shorter than metal3 lines used for the GBLs at a top topological level to substantially reduce power consumption.

5. The method of claim 4 wherein pre-charging further comprises setting a gate signal of the second String-select transistor to a voltage no greater than Vdd and setting a gate signal of the first String-select transistor to 0V to prevent current leak into the common source line at 0V, allowing the pre-charge voltage to be held at the N Strings of NAND memory cells associated with the N BBLs in a selected Block of a selected Segment of a currently selected Group.

6. The method of claim 5 wherein discharging part of the N BBLs and the N SBLs comprises switching the gate signal of the first String-select transistor from 0V to up to Vdd to set charge flow through one or more Strings of NAND memory cells to the common source line at ground 0V in a selected Block, wherein the one or more Strings of NAND memory cell includes an On-state memory cell with threshold level smaller than a Read/Program-Verify/Erase-Verify voltage applied to a selected WL and remaining m−1 memory cells are in conduction states with a pass voltage of about 6V applied to corresponding m−1 WLs.

7. The method of claim 6 wherein discharging further comprises retaining charges with the pre-charge voltage in the remaining part of the N BBLs having an Off-state memory cell with threshold level greater than the Read/Program-Verify/Erase-Verify voltage applied to the selected WL, forming a data pattern in pre-charge voltage or 0V in accordance with a pre-stored page data of the selected page held in the N BBLs in the selected Block.

8. The method of claim 7 wherein sharing the pre-charge voltage comprises switching the second gate signal from 0V to Vdd to allow charge flow from the remaining part of the N BBLs and the N SBLs to the corresponding part of the N GBLs to generate a reduced GBL voltage finally outputted at each of the part of the N GBLs, the reduced GBL voltage being substantially equal to 1/J of the precharge voltage since a parasitic capacitance of each SBL is about 1/J of that of each GBL.

9. The method of claim 8 wherein multiplying the reduced GBL voltage comprises providing a multiplier circuit configured between each GBL and a Latch sense amplifier circuit within the Page Buffer circuit to multiply the reduced GBL voltage with a multiplication factor to output a sense voltage sufficiently large to be sensed and amplified by the Latch sense amplifier to latch a full Vdd/Vss voltage corresponding to the page data to store as a bit into the Page Buffer circuit, the multiplication factor being selected to be greater than 2 depending on the pre-charge voltage.

10. The method of claim 1 wherein further comprising resetting the N GBLs after performing a Read operation on one selected page in a selected Block by grounding the first power/Vss line and switching the first gate signal to Vdd=1.8V for turning on all the N first GBL-select transistors respectively connected between the N GBLs and the first power/Vss line.

11. The method of claim 6 wherein the Read/Program-Verify/Erase-Verify WL voltage comprises a single value applied to a selected WL for identifying two states of a SLC-type NAND memory cell, or 3 values for identifying four states of a MLC-type cell, or 7 values for identifying eight states of a TLC-type cell, or 15 values for identifying 16 states of a XLC-type cell.

12. The method of claim 9 wherein the multiplier circuit comprises M numbers of equal capacitors connected terminal-to-terminal in series allowing to sequentially perform M+1 numbers of sample-and-hold operations on the reduced GBL voltage with two complimentary high and low values at one common input via a HV isolation transistor, wherein M is a programmable positive integer, each capacitor having a first terminal coupled to a source node of a first LV NMOS transistor with a drain node being connected to the common input in parallel and a gate being connected to one sample-and-hold control signal, and a second terminal coupled to a second LV NMOS transistor with source node being connected in parallel to common ground, providing an output signal larger than the reduced GBL voltage by a multiplication factor with a logic high value for an off-cell and logic low value for an on-cell, the multiplication factor being M+1.

13. The method of claim 12 wherein the Latch sense amplifier circuit comprises a latch circuit made by two cross-coupled inverters having one common power supply line being connected to Vdd via a LV PMOS transistor with a clock control, one common sinking line being connected to Vss via a LV NMOS transistor with a complementary clock control, a common input from a connector circuit with voltage conversion from the output signal of the multiplier circuit, and a reference input with a reference voltage set at middle of the logic high value and logic low value of the output signal, for generating logic high/low Vdd/Vss voltages at a pair of complimentary output ports to be stored as 1-bit data in the Page Buffer.

14. A method of performing simultaneous multiple-WL and All-BL Program operation in a NAND memory array with BL-hierarchical structure, the method comprising:
providing a NAND memory circuit, the NAND memory circuit comprising,
a matrix of NAND memory cells divided to a first plurality of Groups in column-direction associated with N global bit lines (GBLs) laid at a metal3 level throughout all Groups respectively for N columns, each Group comprising a second plurality of Segments associated with N sub-bit-lines (SBLs) laid at metal2 level below the metal3 level throughout all Segments in each Group, each Segment comprising a third plurality of Blocks associated with N sub-sub-bit-lines (BBLs) laid at metal1 level below the metal2 level throughout all Blocks in each Segment, each Block comprising N Strings in the column-direction or m Pages in row-direction, each String comprising m NAND memory cells connected in series sandwiched by a first String-select transistor and a second String-select transistor, each NAND memory cell in a Page being associated with a word line (WL), m, and N being integer numbers;

a plurality of metal0 lines laid below the metal1 level along the row-direction, the plurality of metal0 lines including at least a first power/Vss line for N GBLs of all Groups, a second power/Vss line for N SBLs of all Segments in each Group, and a third power/Vss line for N BBLs of all Blocks of a pair of neighboring Segments;

N first GBL-select transistors commonly controlled by a first gate signal to respectively couple the N GBLs with the first power/Vss line;

N second GBL-select transistors commonly controlled by a second gate signal to respectively couple the N GBLs with the corresponding N SBLs;

N first SBL-select transistors commonly controlled by a third gate signal to respectively couple the N SBLs with the second power/Vss line;

N second SBL-select transistors commonly controlled by a fourth gate signal to respectively couple the N SBLs with the corresponding N BBLs;

N BBL-select transistors commonly controlled by a fifth gate signal to respectively couple the N BBLs with the third power/Vss line; and a N-bit Page Buffer circuit respectively coupled to the N GBLs via N-bit HV transistors with N-bit latches to temporarily store and pass multiple page data in sequential pipeline manner;

pre-charging the N BBLs and the N SBLs in one or more selected Groups to a pre-charge voltage;

discharging part of the N BBLs and the N SBLs to generate a reduced GBL low voltage in part of N GBLs;

sharing the pre-charge voltage in the remaining part of the N BBLs and the N SBLs with the corresponding N GBLs to generate a reduced GBL high voltage in remaining part of GBLs;

multiplying the reduced GBL high/low voltage in each GBL by a programmable multiplication factor before being sensed by a sense amplifier to fully amplify to Vdd/Vss voltage to latch a corresponding page data to the N-bit Page Buffer circuit for storing as N digital bits.

15. The method of claim 14 further comprising pre-discharging N GBLs by setting the first gate signal to Vdd to turn on the N first GBL-select transistors to connect with the first power/Vss line in ground level 0V, pre-discharging N SBLs comprises setting the third gate signal to Vdd to turn on the N first SBL-select transistors to connect with the second power/Vss line in ground level 0V, and pre-discharging N BBLs comprises setting the fifth gate signal to Vdd to turn on the N BBL-select transistors to connect with the third power/Vss line in ground level 0V.

16. The method of claim 14 wherein pre-charging the N BBLs and the N SBLs comprises supplying Vdd or up to 7V to the corresponding second power/Vss line, setting the third gate signal and the fourth gate signal to Vdd+Vt up to 7V+Vt depending on the BVDS of transistors connected to SBLs, BBLs, and GBLs to turn on the N first SBL-select transistors to connect the N SBLs to the N BBLs, and setting the fifth gate signal from Vdd to 0V, both the N SBLs and the N BBLs being isolated from the N GBLs by setting the second gate signal to 0V, the pre-charge voltage being stored at parasitic capacitances associated with the BBLs at the metal1 level connected with the corresponding SBLs at metal2 level within one selected Segment.

17. The method of claim 16 wherein pre-charging further comprises setting a gate signal of the second String-select transistor to a voltage no greater than the pre-charge voltage and setting a gate signal of the first String-select transistor to 0V, allowing the pre-charge voltage to be held at the N Strings of NAND memory cells associated with the N BBLs in a selected Block of a selected Segment of a currently selected Group.

18. The method of claim 17 wherein discharging part of the N BBLs and the N SBLs comprises reaching a predetermined Logic low voltage or 0V in accordance with "1" data stored in a selected page of N NAND memory cells by switching the gate signal of the first String-select transistor from 0V to up to Vdd to set charge flow through one or more Strings of NAND memory cells in a selected Block to a common source line at ground 0V, wherein the one or more Strings of NAND memory cell includes at least one On-state memory cell with threshold level smaller than a Read/Program-Verify/Erase-Verify voltage applied to a selected WL and remaining at most m−1 memory cells are in conduction states with a pass voltage of about 4-6V applied to corresponding m−1 WLs.

19. The method of claim 18 wherein discharging further comprises retaining charges to keep a predetermined Logic high voltage in each of the remaining part of the N BBLs in accordance with "0" data stored in the selected page of N NAND memory cells including at least one Off-state memory cell with threshold level greater than the Read/Program-Verify/Erase-Verify voltage applied to the selected WL, forming a data pattern of Logic high/low voltages in accordance with a pre-stored page data of the selected page held in the N BBLs in the selected Block.

20. The method of claim 19 wherein multiplying the reduced GBL high/low voltage comprises providing a M-capacitor based multiplier circuit to multiply the reduced GBL high/low voltage with a multiplication factor of M+1 to obtain a multiplied Logic high/low voltage and a Latch sense amplifier circuit to sense the multiplied Logic high/low voltage and further to amplify the multiplied Logic high/low voltage to latch a full Vdd/Vss voltage corresponding to the page data to store as a bit into the N-bit Page Buffer, the multiplication factor being programmable by selecting one through M number of capacitors in the M-capacitor multiplier circuit depending on the selected Block located from a nearest to a farthest Segment from a nearest to a farthest Group relative to the N-bit Page Buffer circuit.

21. The method of claim 14 wherein further comprising resetting the N GBLs after performing a Read operation on one selected page in a selected Block by grounding the first power/Vss line and switching the first gate signal to Vdd or higher for turning on all the N first GBL-select transistors respectively connected between the N GBLs and the first power/Vss line.

* * * * *